(12) United States Patent
Aoyama

(10) Patent No.: US 7,235,953 B2
(45) Date of Patent: Jun. 26, 2007

(54) SYSTEM AND METHOD FOR DETERMINING WHETHER A CHARGING WIRE IS BROKEN

(75) Inventor: Toru Aoyama, Okazaki (JP)

(73) Assignee: Denso Corporation, Kariya (JP)

( * ) Notice: Subject to any disclaimer, the term of this patent is extended or adjusted under 35 U.S.C. 154(b) by 56 days.

(21) Appl. No.: 11/286,282

(22) Filed: Nov. 25, 2005

(65) Prior Publication Data

US 2006/0108987 A1    May 25, 2006

(30) Foreign Application Priority Data

Nov. 25, 2004  (JP)  ............................. 2004-340900
May 25, 2005   (JP)  ............................. 2005-152967

(51) Int. Cl.
   H02J 7/04    (2006.01)
   H02J 7/14    (2006.01)

(52) U.S. Cl. ........................... 322/28; 322/37; 322/99; 320/123

(58) Field of Classification Search ................. 322/22, 322/23, 25, 28, 37, 99, 100; 320/123, 127, 320/137
   See application file for complete search history.

(56) References Cited

U.S. PATENT DOCUMENTS

| | | | | |
|---|---|---|---|---|
| 3,942,097 A | * | 3/1976 | Itoh et al. ..................... 322/28 |
| 4,336,487 A | * | 6/1982 | Tanaka et al. ................. 322/99 |
| 4,379,990 A | * | 4/1983 | Sievers et al. ................ 322/99 |
| 4,470,004 A | * | 9/1984 | Morishita et al. ............. 322/99 |
| 4,543,521 A | * | 9/1985 | Morishita et al. ........... 320/123 |
| 4,618,811 A | | 10/1986 | Mashino et al. |
| 5,151,646 A | | 9/1992 | Vercesi et al. |
| 5,698,965 A | * | 12/1997 | York .......................... 307/130 |
| 6,005,372 A | * | 12/1999 | Kouwa et al. ................ 322/25 |
| 6,486,634 B2 | * | 11/2002 | Kokubun et al. ........... 320/104 |
| 7,009,366 B2 | * | 3/2006 | Maehara ...................... 322/28 |

FOREIGN PATENT DOCUMENTS

| | | |
|---|---|---|
| JP | A 59-148538 | 8/1984 |
| JP | A 4-222426 | 8/1992 |
| JP | A 2002-325085 | 11/2002 |

* cited by examiner

Primary Examiner—Nicholas Ponomarenko
(74) Attorney, Agent, or Firm—Oliff & Berridge PLC

(57) ABSTRACT

In a system, a generator is configured to charge a battery through a charging wire connecting therebetween. A first unit measures a voltage of the battery, and a second unit detects an operating rate of the generator. A third unit determines that the charging wire is broken when the measured battery voltage is lower than a predetermined threshold voltage and the detected operating rate of the generator is lower than a predetermined threshold value.

26 Claims, 9 Drawing Sheets

SYSTEM AND METHOD FOR DETERMINING WHETHER A CHARGING WIRE IS BROKEN

CROSS REFERENCE TO RELATED APPLICATIONS

This application is based on Japanese Patent Applications 2004-340900 and 2005-152967, filed on Nov. 25, 2004 and May 25, 2005, respectively. This application claims the benefit of priority therefrom, so that the descriptions of which are all incorporated herein by reference.

FIELD OF THE INVENTION

The present invention relates to systems and methods for determining whether a charging wire is broken.

BACKGROUND OF THE INVENTION

A battery installed in, for example, a vehicle and a generator for charging the battery are connected through a charging cable. As conventional battery chargers capable of detecting a break in the charging cable, various types of them have been well known.

As one example of the conventional battery chargers, a voltage regulating apparatus for charging generators is disclosed in U.S. Pat. No. 4,618,811 corresponding Japanese Unexamined Patent Publication No. S59-148538. As another one example of the conventional batter chargers, a battery recharging system for a motor vehicle is disclosed in U.S. Pat. No. 5,151,646 corresponding to Japanese Unexamined Patent Publication No. H4-222426.

The voltage regulating apparatus disclosed in the former Publication is provided with a charging generator and a voltage regulator. The charging generator includes an AC (Alternating Current) generator and a rectifying circuit. The output terminal of the rectifying circuit is connected to a battery through a charging cable. The voltage regulator has L and S terminals, the L terminal of which is connected to the output terminal of the rectifying circuit, and the S terminal of which is connected to the positive terminal of the battery.

The voltage regulator regulates the output voltage of the charging generator based on the voltages at the L terminal and S terminal. The voltage regulator also determines that the charging cable has a break when the difference between the voltage at the L terminal and that at the S terminal exceeds a predetermined value, thereby stopping the operation of the charging generator and generating an alarm.

In addition, the battery recharging system for a vehicle disclosed in the later Publication includes a current generator, a switch, an indicator lamp, and a voltage regulator. The current generator includes an alternator and an associated rectifier whose output terminal is connected to the positive terminal of a battery through a connecting cable.

The voltage regulator is provided with first and second input terminals A and L, the first input terminal A of which is connected to the output terminal of the current generator, the second input terminal of which is connected the positive terminal of the battery through the switch and the lamp.

The voltage regulator regulates the output voltage of the current generator based on the potential at the first input terminal A and that of the second input terminal L. The voltage regulator also determines that the connecting cable has a break when the potential difference between the potential at the first input terminal A and that at the second input terminal L is greater than a pre-established reference value, thereby causing the lamp to be lit to indicate the interruption of connection between the battery and the current generator.

In order to reduce environmental pollution by vehicles and energy consumption thereby, vehicle control has been integrated. For example, when integrated vehicle control is applied to a battery charging system, the integrated vehicle control optimizes the alternator output when an engine runs at idle to regulate emissions. The integrated vehicle control also regulates the alternator output during acceleration and deceleration to control energy consumption of vehicle electric loads. This integrated vehicle control uses a plurality of ECUs (Electronic Control Units) as external control units, various sensors connected thereto, and actuators whose operations are controlled by the ECUs.

In order to achieve the efficient integrated vehicle control, there have been prepared a plurality of data communication control methods between ECUs (external control units) and an alternator.

One conventional example of data communication control methods between ECUs and an alternator is disclosed in Japanese Unexamined Patent Publication No. 2002-325085. The communication method disclosed in the Publication establishes bus line connections between ECUs and an alternator, and allows the ECUs to communicate a plurality of information codes with the alternator through the bus lines.

When data communication control methods are applied to communications between a charging generator and a voltage regulator of a voltage regulating apparatus, it is necessary to convert the alternator output into an information code (digital value). Similarly, when data communication control methods are applied to communications between a current generator and a voltage regulator of a battery recharging system for automobiles, it is also necessary to convert the output of the current generator into an information code (digital value).

For these reasons, in order to use the data communication control methods, the alternator or the current generator has to provide an A/D (Analog to Digital) converting circuit for converting the output of the alternator or the current generator into an information code. Installation of the A/D converter into the alternator or the current generator may however contribute to increase of the commit size of the alternator or the current generator, which may cause the voltage regulating apparatus and the battery recharging system to increase in size and cost.

SUMMARY OF THE INVENTION

The present invention has been made on the background above so that at least one preferable embodiment of the present invention provides a battery charging system with a simple structure, which is capable of detecting a break in a charging cable connecting between a generator and a voltage regulator without using A/D converters.

According to one aspect of the present invention, there is provided a method of determining whether a charging wire connecting between a battery and a generator is broken. The generator is configured to charge the battery through the charging wire. The method includes measuring a voltage of the battery, detecting an operating rate of the generator, and determining that the charging wire is broken when the measured battery voltage is lower than a predetermined threshold voltage and the detected operating rate of the generator is lower than a predetermined threshold value.

According to another aspect of the present invention, there is provided a method of determining whether a charging wire connecting between a battery and a generator is broken, in which the generator is configured to charge the battery through the charging wire. The method includes determining whether the battery is in discharge, and detecting an operating rate of the generator. The method also includes determining that the charging wire is broken when it is determined that the battery is in discharge and the detected operating rate is within a predetermined range, the predetermined range being determined by a first upper limit threshold value and a lower limit threshold value.

According to a further aspect of the present invention, there is provided a system for determining whether a charging wire connecting between a battery and a generator is broken. The generator is configured to charge the battery through the charging wire. The system includes a first unit configured to measure a voltage of the battery, and a second unit configured to detect an operating rate of the generator. The system also includes a third unit configured to determine that the charging wire is broken when the measured battery voltage is lower than a predetermined threshold voltage and the detected operating rate of the generator is lower than a predetermined threshold value.

According to a still further aspect of the present invention, there is provided a system for determining whether a charging wire connecting between a battery and a generator is broken. The generator is configured to charge the battery through the charging wire. The system includes a first unit configured to determine whether the battery is in discharge, and a second unit configured to detect an operating rate of the generator. The system also includes a third unit configure to determine that the charging wire is broken when it is determined that the battery is in discharge and the detected operating rate is within a predetermined range. The predetermined range is determined by an upper limit threshold value and a lower limit threshold value.

According to a still further aspect of the present invention, there is provided a battery charging system. The battery charging system includes a battery, a generator, and a charging wire connecting between the battery and the generator. The generator is configured to charge the battery trough the charging wire. The battery charging system also includes a first unit configured to measure a voltage of the battery, and a second unit configured to detect an operating rate of the generator. The battery charging system further includes a third unit configured to determine that the charging wire is broken when the measured battery voltage is lower than a predetermined threshold voltage and the detected operating rate of the generator is lower than a predetermined threshold value.

According to a still further aspect of the present invention, there is provided a battery charging system. The battery charging system includes a battery, a generator, and a charging wire connecting between the battery and the generator. The generator is configured to charge the battery through the charging wire. The battery charging system further includes a first unit configured to determine whether the battery is in discharge, and a second unit configured to detect an operating rate of the generator. Still further the battery charging system includes a third unit configured to determine that the charging wire is broken when it is determined that the battery is in discharge and the detected operating rate is within a predetermined range. The predetermined range is determined by an upper limit threshold value and a lower limit threshold value.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the present invention win be described hereinafter with reference to the accompanying drawings. In each embodiment, the preset invention is applied to a battery charging system for charging a battery installed in a vehicle.

First Embodiment

Figure 1:
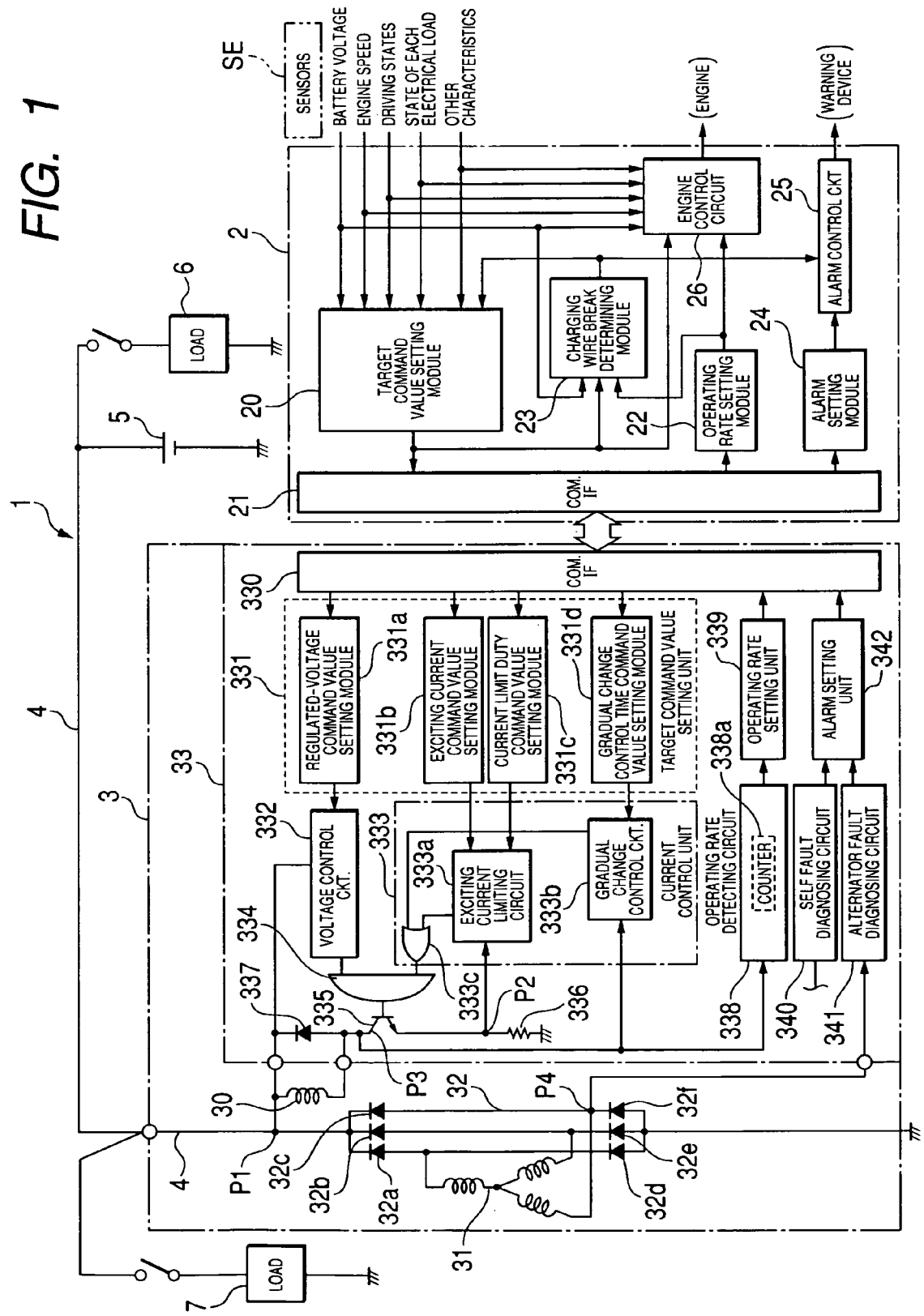
FIG. 1 is a circuit diagram schematically illustration an example of the circuit structure of a battery charging system according to a first embodiment of the present invention.
Figure 2:
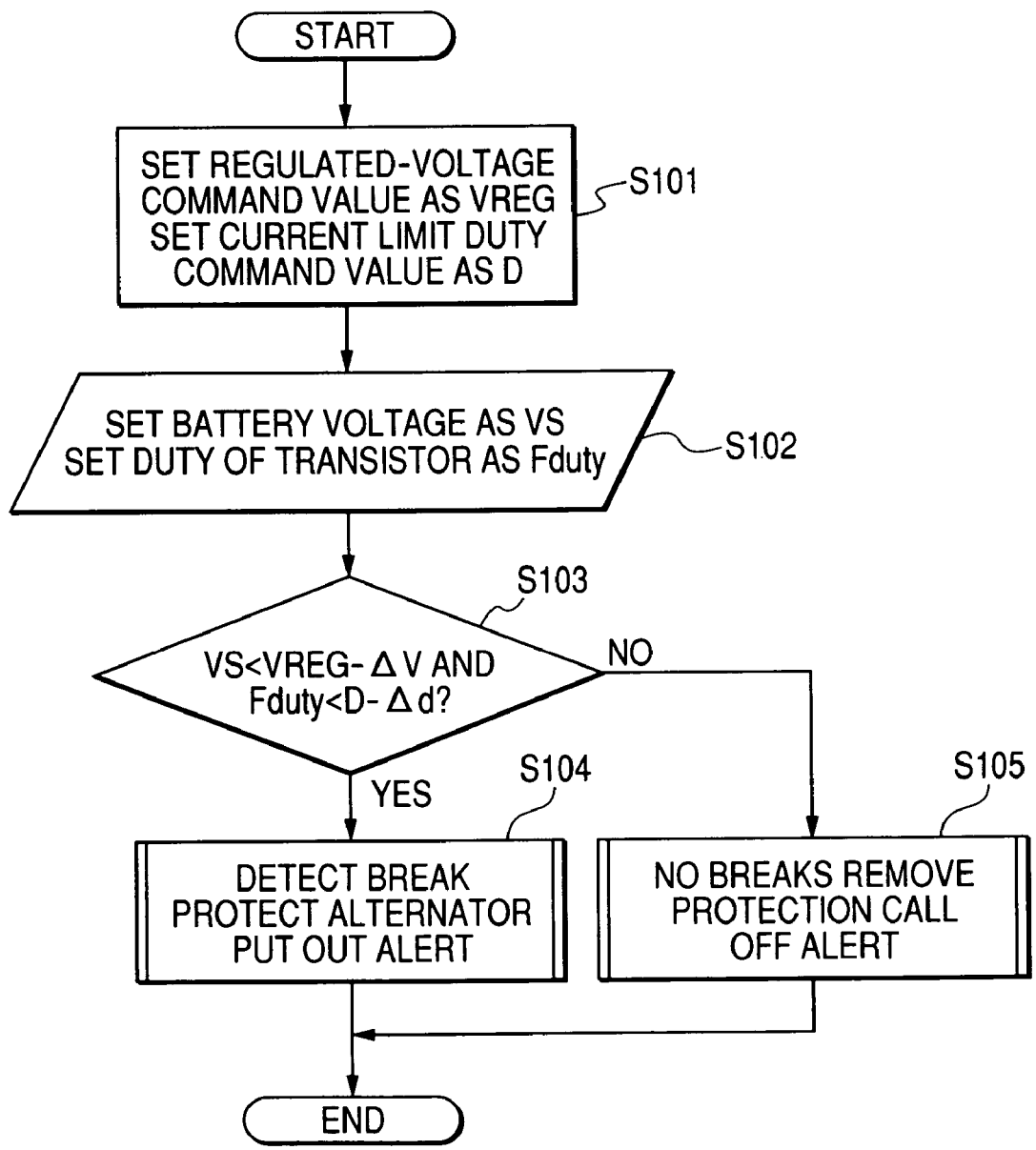
FIG. 2 is a flowchart schematically illustrating an example of operations of the battery charging system illustrated in FIG. 1.

An example of the circuit structure of a battery charging system 1 according to the first embodiment is illustrated in FIG. 1, and an example of operations of the battery charging system 1 to detect a break in a charging wire 4 is illustrated in FIG. 2.

Referring to FIGS. 1 and 2, the battery charging system 1 is installed in a vehicle, such as an automobile, in which at least one electrical load 6 and a battery 5 are installed.

The battery charging system 1 includes a control unit 2 and an alternator 3 as a generator 3 for vehicles. The control unit 2 is located at the exterior of the alternator 3. The alternator 3 is provided with an output terminal connected to the positive terminal of the battery 5 through the charging cable 4. To the positive terminal of the battery 5 the electrical load 6 is connected. Another at least one electrical load 7 is directly connected to the output terminal of the alternator 3.

The external control unit 2 is operative to determine a plurality of target command values required to control the alternator 3. The external control unit 2 is also operative to detect a break in the charging wire 4 and to detect alternator faults, thereby protecting it and generating an alarm.

Specifically, the external control unit 2 is provided with a target command value setting module 20, a communication interface (COM. IF) 21, an operating rate setting module 22, a charging wire break determining module 23, an alarm setting module 24, an alarm control circuit 25, and an engine control circuit 26.

The external control unit 2 can be designed to a microcomputer and peripheral circuits communicating therewith. In this design, each of the modules and circuits of the external control unit 2 can be designed to functional modules provided by operations of the microcomputer in accordance with programs installed in a memory of thereof and the peripheral circuits and/or hardware modules controlled by the microcomputer. Moreover, the external control unit 2 can be designed to digital/analog integrated circuits corresponding to the modules and circuits thereof.

The target command setting module 20 is operative to compare characteristics of the vehicle and each of the electrical loads 6 and 7 with predetermined reference values and to determine a plurality of target command values required to control the alternator 3 based on the compared results and on data indicative of whether the charging wire 4 is broken. The characteristics of the vehicle include a voltage of the battery 5, an engine speed and d o states (acceleration/deceleration), and those of each of the electrical loads 6 and 7 include the state of each of the loads 6 and 7. These characteristics of the vehicle and each electrical load are sensed and/or measured by corresponding sensors SE. The sensors SE are so installed in the vehicle as to sense and/or measure the corresponding characteristics. The measured characteristics by the sensors SE are sent therefrom to the external control unit 2 (the target command setting module 20).

The target command values includes a regulated-voltage command value required to determine the output (output direct current voltage) of the alternator 3, and an exciting current command value required to cause an exciting current (field current) to flow through at least one field winding (exciting winding) 30. The target command value also includes a current limit duty command value required to limit the field current flowing through the field winding 30, and a gradual change control time command value required to determine a period for gradually changing the field current.

The target command value setting module 20 is also operative to convert the plurality of target command values into information codes (a plurality of pieces of digital data) that meets predetermined communication procedures between the alternator 3 and the external control unit 2, thereby passing the converted target command values to the communication interface 21. The target command value setting module 20 is further operative to pass the regulated-voltage command value and the current limit duty command value to the charging wire break determining module 23, and to pass the plurality of target command values to the engine control circuit 26.

The communication interface 21 is operative to receive the information codes passed from the target command value setting module 20 and to send them to the alternator 3 in accordance with the communication procedures. The complication interface 21 is also operative to receive information codes sent from the alternator 3 in response to a request generated by the control unit 2, thereby passing them to both the operating rate setting module 22 and the alarm setting module 24.

The operating rate setting module 22 is operative to extract an operating rate of the alternator 3 from the information codes received by the communication interface 21; this extracted operating rate of the alternator 3 is detected by an operating rate detecting circuit 338 described hereinafter. The operating rate setting module 22 is also operative to pass the extracted operating rate of the alternator 3 to the charging wire break determining module 23 and the engine control circuit 26.

The charging wire break determining module 23 is operative to determine whether the charging wire 4 is broken based on the regulated-voltage command value and the determined current limit duty command value, the voltage of the battery 5, the exacted operating rate of the alternator 3, a predetermined acceptable voltage drop, and a permissible duty.

The alarm setting module 24 is operative to extract the information indicative of whether the alternator 3 is defective from the information codes received by the communication interface 21. The alarm setting module 24 is also operative to determine whether to detect a fault in the alternator 3 based on the extracted information. The alarm setting module 24 is further operative to pass the determination result thereof to the alarm control circuit 25.

The alarm control circuit 25 is configured to, when the determination result passed from the alarm setting module 24 represents that the alternator fault is found, execute predetermined operations to protect the battery charging system 1 and to output an alarm signal to a warning device (not shown).

The engine control circuit 26 is configured to control the engine based on the characteristics of the vehicle and each of the electrical loads 6 and 7, the plurality of target command values set by the target command value setting module 20, and the operating rate determined by the operating rate setting module 22. The characteristics includes the engine speed, the driving states, and the state of each of the loads 6 and 7.

The alternator 3 works to output a stabilized DC voltage for charging the battery 5, thereby supplying power to the electrical load 6, and to feed the output DC voltage to the electrical load 7 directly connected thereto based on the plurality of target command values provided by the control unit 2.

Specifically, the alternator 3 includes the exciting windings 30, three-phase windings (stator windings) 31, a rectifier 32, and a controller 33.

The field winding (exciting winding) 30 is wound around a rotor (not shown). The rotor is coupled to a crankshaft of the engine through a belt to be rotatable therewith. When a field current is applied to the field winding 30 of the rotor that is rotating, the rotating field winding 30 create magnetic fluxes. One end of the field winding 30 is connected to the battery 5 and the controller 33 through the charging line 4, and the other end of the field winding 30 is connected to the controller 33.

The phase windings (stator windings) 31 are wound around a stator (not shown) that surrounds the rotor. The created magnetic fluxes by the field winding 30 induce a three-phase alternating current (AC) voltage in the stator windings 31.

The rectifier 32 is operative to full-wave rectify the induced three-phase AC voltage in the stator windings 31 to a DC voltage.

Specifically, the rectifier 21 is composed of, for example, first to sixth diodes 32a to 32f in bridge connection. The cathode of each of the high-side diodes 32a to 32c of the three-phase bridge is connected to the battery 5 through the charging wire 4, and the anode of each of the low-side diodes 32d to 32f is connected to the body of the vehicle to be grounded.

The controller 33 is operative to control the field current (exciting current) based on the plurality of target command values to control the DC voltage output of the alternator 3.

Specifically, the controller 33 includes an communication interface 330, a target command value setting unit 331, a voltage control circuit 332, a current control circuit 333, an AND circuit 334, and a transistor, such as an NPN bipolar transistor 335. The controller 33 also includes, a resistor 336 for detection of the exciting current, a flywheel diode 337, an operating rate detecting circuit 338, an operating rate setting unit 339, a self fault diagnosing circuit 340, an alternator fault diagnosing circuit 341, and an alarm setting unit 342.

The controller 33 can be designed to a microcomputer and peripheral circuits communicating therewith, so that each of the units and circuits of the controller 33 can be designed to functional modules provided by operations of the microcomputer in accordance with programs installed in a memory of thereof and the peripheral circuits and/or hardware modules controlled by the microcomputer. Moreover, the controller 33 can be designed to digital/analog integrated circuits corresponding to the modules and circuits thereof.

The communication interface 330 is operative to receive the information codes sent from the control unit 2 and to pass them to the target command value setting unit 331. The communication interface 330 is also operative to send, to the control unit 2 in the communication procedures, information codes corresponding to the operating rate of the alternator 3 set by the operating rate setting unit 339 and corresponding to information indicative of whether the alternator 3 is defective set by the alarm setting unit 342.

The target command value setting unit 331 has a function of extracting the plurality of target command values from the received information codes. Specifically, the target command value setting unit 331 includes a regulated-voltage command value setting module 331a, an exciting current command value setting module 331b, a current limit duty command value setting module 331c, and a gradual change control time command value setting module 331d.

The regulated-voltage command value setting module 331a is operative to extract the regulated-voltage command value from the received information codes to convert it into a target voltage. The exciting current command value setting module 331b is operative to extract the exciting current (field current) command value from the received information codes to pass it to the current control circuit 333.

The current limit duty command value setting module 331c is operative to extract the current limit duty command value from the received information codes to pass it to the current control circuit 333. The gradual change control time command value setting module 331d is operative to extract the gradual change control time command value from the received information codes to pass it to the current control circuit 333.

An input terminal of the circuit 332 is connected to a connection point P1 connecting between the charging line 4 and the rectifier 32, and an output terminal of which is connected to the AND circuit 334.

The voltage control circuit 332 is designed to generate, based on the target voltage determined by the module 331a and the DC voltage output from the alternator 3, a voltage control signal, such as a PWM (Pulse Width Modulation) signal, required to control the exciting current. The PWM signal consists of a train of pulses of high and low voltage levels at predetermined time intervals (periods) with a predetermined reference duty in each period. The reference duty is determined based on comparison of the regulated-voltage command value with the alternator output so that the alternator output approaches the regulated-voltage command value (target voltage).

The voltage control circuit 332 is also designed to output the voltage control signal to the AND commit 334.

The current control circuit 333 is designed to generate, based on the exciting current command value, the current limit duty command value, the gradual change control time command value, the exciting current, and the switching state of the transistor 335, a current control signal for controlling an exciting current flowing trough the exciting windings 30.

The current control circuit 333 is also designed to output the current control signal to the AND circuit 334. Specifically, the current control circuit 333 is composed of an exciting current limiting circuit 333a, a gradual change control circuit 333b, and an OR circuit 333c.

An input terminal of the exiting current limiting circuit 333a is connected to a connection point P2 between the emitter terminal of the transistor 335 and the resistor 336, and an output terminal of which is connected to the OR circuit 333c.

The exciting current limiting circuit 333a is operative to generate an exciting current limit signal based on the exciting current command value, the current limit duty command value and the exciting current flowing through the exciting windings 30.

Specifically, for example, the exciting current limit signal consists of a train of pulses of high and low voltages at predetermined time intervals with a predetermined duty for reducing the reference duty of the voltage control signal so as to cause the exciting current to be lower than a predetermined value.

An input terminal of the gradual change control circuit 333b is connected to connection point P3 between the other end of the exciting winding 30 and the collector of the transistor 335, and an output terminal of which is connected to the OR circuit 333c.

The gradual change control circuit 333b is operative to generate, based on the gradual change control time and the switching state of the transistor 335, a gradual change control signal for gradually changing the exciting current.

Specifically, for example, the gradual change control signal consists of a train of pulses of high and low voltages at predetermined time intervals with a predetermined duty for increasing (gradually increasing) the reference duty of the voltage control signal.

An input terminal of the OR circuit 333c is connected to the output terminals of the exciting current limit circuit 333a and the gradual change control circuit 333b, and an output terminal of the OR circuit 333c is connected to the AND circuit 334.

The OR circuit 333c is operative to execute the logical OR operation of the exciting current limit signal and the gradual change control signal to generate a current control signal for controlling the exciting current.

Specifically, for example, when alternator torque is abruptly reduced, the OR circuit 333c outputs the current control signal equivalent to the exciting current limit signal to the AND circuit 334. When power requirements of the electrical loads 6 and 7 are increased (for example, the engine speed decreases or the electrical loads 6 and 7 are applied), the OR circuit 333c outputs the current control signal equivalent to the gradual change control signal to the AND circuit 334.

An input terminal of the AND circuit 334 is connected to the output terminals of the voltage control circuit 332 and the current control circuit 333, and an output terminal of the AND circuit 334 is connected to the base of the transistor 335.

The AND circuit 334 is operative to execute the logical AND operation of the voltage control signal outputted from the circuit 332 and the current control signal outputted from the circuit 333 to generate a switching signal for switching of the transistor 335 so as to control the exciting current.

The operation of the AND circuit 334 allows, when alternator torque is abruptly reduced, the exciting current to decrease, and when power requirements of the electrical loads 6 and 7 are increased (for example, the engine speed decreases or the electrical loads 6 and 7 are applied), the exciting current to gradually increase. This makes it possible to optimize the alternator output depending on variations in power requirements of the electrical loads and/or the engine speed.

The transistor 335 works to turn on or off based on the switching signal outputted from the AND circuit 334 so as to control the exciting current. Specifically, the base of the transistor 335 is connected to the output terminal of the AND circuit 334, and the collector thereof is connected to the output terminal of the exciting winding 30. The emitter of the transistor 335 is connected to the body of the vehicle through the resistor 336 to be grounded. The connection point P3 between the collector of the transistor 335 and the output terminal of the exciting winding 30 is connected to the gradual change control circuit 333b and the operating rate detecting circuit 338. The connection point P2 between the emitter of the transistor 335 and the resistor 336 is connected to the exciting current limit circuit 333a.

The flywheel diode 337 is operative to allow flywheel current to flow therethrough; this flywheel current is generated when the transistor 335 is turned off. The cathode of the flywheel diode 337 is connected to the one end of the exciting winding 30, and the anode of the flywheel diode 337 is connected to the other end thereof.

An input terminal of the operating rate detecting circuit 338 is connected to the connection point P3 between the output terminal of the exciting winding 30 and the collector of the transistor 335.

The operating rate detecting circuit 338 is designed to detect a duty of the transistor 335, which corresponds to the operating rate of the alternator 3. The operating rate of the alternator 3 means a ratio of the alternator output (output power) to the maximum alternator output (output power) that the alternator 3 can output. The operating rate of the alternator 3 also means the ratio of the exciting current to the maximum exciting current that is permitted to flow through the exciting winding 30.

The duty of the transistor 335 means the ratio of the on time of the transistor 335 to each switching (on and off) period. For example, when the transistor 335 is always on state, the duty of the transistor is set to 100%, which allows the transistor 335 to supply the maximum exciting current to the exciting winding 30. In contrast, when the transistor 335 is always off state, the duty of the transistor is set to 0%, which causes the transistor 335 to interrupt the current to the exciting winding 30.

To sum up, the duty of the transistor 335 shows the ratio of the exiting current to the maximum exciting current, that is, the conductivity of the transistor 335, which is equivalent to the operating rate of the alternator 3.

In the first embodiment, the operating rate detecting circuit 338 is designed to a simple-structured digital circuit, such as a counter 338a, without using A/D converters.

For example, the counter 338a measures each switching period of the transistor 335 and the on time of the transistor 335 in each period to calculate, based on the measured values, the ratio of the on time to each switching period as the duty of the transistor 335 expressed in percentage. For another example, the counter 338a counts the on time of the transistor 335 in each switching period to calculate, based on the count value, the ratio of the on time to each switching period of time as the duty of the transistor 335 expressed in percentage when each switching period is constant.

The operating rate setting unit 339 is operative to convert the duty of the transistor 335 corresponding to the operating rate of the alternator 3, which is detected by the operating rate detecting circuit 338, into an information code, thereby passing it to the communication interface 330. The information code meets the predetermined communication procedures between the alternator 3 and the control unit 2.

The self fault diagnosing circuit 340 is operative to diagnose faults in the controller 33 itself and to pass information indicative of the diagnosed result to the alarm setting unit 342. An input terminal of the alternator fault detecting circuit 341 is a connection point P4 between the paired high-side and low-side diodes 32c and 32f connected to one-phase of the stator windings 31.

The alternator fault diagnosing circuit 341 is operative to diagnose faults in the exciting winding 30 and/or the stator windings 31 on the output AC voltage from the stator winding 31 and to pass information indicative of the diagnosed result to the alarm setting unit 342.

The alarm setting unit 342 is operative to convert the pieces of information passed from the self fault detecting circuit 340 and the alternator fault diagnosing circuit 341 into an information code that meets the predetermined communication procedures between the alternator 3 and the control unit 2, thereby ping it to the communication interface 330.

Next, operations of the controller 33 and the control unit 2 will be described hereinafter with reference to FIGS. 1 and 2. Turning on of an ignition switch (not shown) allows the engine to start and the control unit 2 to start control of the alternator 3.

In this structure of the battery charging system 1, when the alternator output is greater than the battery voltage, current will flow from the alternator 3 to the electrical load 7 and the battery 5. The alternator output is controlled by the controller 33 and the control unit 2 depending on the battery voltage and other parameters.

Specifically, as illustrated in FIG. 1, the target command value setting module 20 of the control unit 2 compares the characteristics of the vehicle and each of the electrical loads 6 and 7 with the predetermined reference values. Next, the module 20 determines the regulated-voltage command value, the exciting current command value, the current limit duty command value, and the gradual change control time command value based on the compared results. These determined command values are converted into information codes to be passed to the communication interface 21.

The communication interface 21 sends, to the controller 33 of the alternator 3, the information codes corresponding to the regulated-voltage command value, the exciting current command value, the current limit duty command value, and the gradual change control time command value.

The communication interface 330 of the controller 33 receives the information codes sent from the control unit 2, and passes them to the regulated-voltage command value setting module 331a, the exciting current command value setting module 331b, the current limit duty command value setting module 331c and the gradual change control time command value setting module 331d, respectively.

The regulated-voltage command value setting module 331a extracts the regulated-voltage command value from the received information codes to convert it into the target voltage. The exciting current command value setting module 331b extracts the exciting current command value from the received information codes to pass it to the current control circuit 333. Moreover, the setting module 331c extracts the current limit duty command value from the received information codes to pass it to the current control circuit 333, and the gradual change control time command value setting module 331d extracts the gradual change control time command value from the received information codes to pass it to the current control circuit 333.

The voltage control circuit 332 generates the voltage control signal required to control the exciting current based on the target voltage determined by the module 331a and the DC voltage output from the alternator 3, thereby outputting the generated voltage control signal to the AND circuit 334.

The current control circuit 333 generates, based on the exciting current command value, the current limit duty command value, the gradual change control time command value, the exciting current, and the switching state of the transistor 335, the current control signal for controlling the exciting current flowing trough the exciting windings 30. Thereafter, the current control circuit 333 outputs the generated current control signal to the AND circuit 334.

The AND circuit 334 executes the logical AND operation of the voltage control signal outputted from the circuit 332 and the current control signal outputted from the circuit 333 to generate the switching signal for switching of the transistor 335 so as to control the exciting current. The AND circuit 334 outputs the generated switching signal to the base of the transistor 335.

The transistor 335 operates to turn on or off based on the switching signal outputted from the AND circuit 334 in each switching period. The duty of the transistor 335 in each switching period control the exciting current. This allows the alternator 3 to stably output the DC voltage corresponding to the target voltage (regulated-voltage command value).

On the other band, the alternator 3 sends information associated with the conditions thereof. Specifically, the operating rate detecting circuit 338 detects the duty of the transistor 335 corresponding to the operating rate of the alternator 3. The duty of the transistor 335 equivalent to the operating rate of the alternator 3 is converted, by the operating rate setting unit 339, into the information code meeting the predetermined communication procedures between the alternator 3 and the control unit 2, thereby being passed to the communication interface 330.

In addition, the self fault diagnosing circuit 340 diagnoses faults in the controller 33 itself and passes information indicative of the diagnosed result to the alarm setting unit 342. Similarly, the alternator fault diagnosing circuit 341 diagnoses faults in the exciting winding 30 and/or the stator windings 31 based on the output AC voltage from the stator winding 31 and passes information indicative of the diagnosed result to the alarm setting unit 342. The pieces of information passed from the self fault detecting circuit 340 and the alternator fault diagnosing circuit 341 are converted, by the alarm setting unit 342, into an information code that meets the predetermined communication procedures between the alternator 3 and the control unit 2, thereby being passed to the communication interface 330.

The communication interface 330 sends, to the control unit 2 in the communication procedures, the information codes passed from the operating rate setting unit 339 and the alarm setting unit 342.

The communication interface 21 receives the information codes sent from the communication interface 330 of the alternator 3 to pass the received information codes to the operating rate setting module 22 and the alarm setting module 24.

The operating rate setting module 22 extracts the duty of the alternator 3 from the information codes passed from the communication interface 21; this extract duty of the alternator 3 corresponds to the operating rate thereof. The operating rate setting module 22 passes the extracted duty of the alternator a to the charging break determining module 23 and the engine control circuit 26.

The alarm setting module 24 extracts the information indicative of whether the alternator 3 is defective from the information codes passed from the communication interface 21, and determines whether to detect a fault in the alternator 3 based on the extracted information. The alarm setting module 24 passes the determination result thereof to the alarm control circuit 25.

The charging wire break determining module 23 determines whether the charging wire 4 is broken based on the regulated-voltage command value and the current limit duty command value determined by the target command setting module 20, the voltage of the battery 5, the duty of the alternator 3 corresponding to the operating rate thereof extracted by the operating rate setting module 22, the predetermined acceptable voltage drop $\Delta V$, and the permissible duty $\Delta D$.

When the determination result passed from the alarm setting module 24 represents that the alternator fault is found, the alarm control circuit 25 executes the predetermined operations to protect the battery charging system 1 and outputs the alarm signal to the warning device (not shown).

The engine control circuit 26 controls the engine based on the characteristics of the vehicle and each of the electrical loads 6 and 7, the plurality of target command values set by the target command value setting module 20, and the operating rate determined by the operating rate setting module 22.

Next, break finding operations of the charging wire break determining module 23 of the control unit 2 will be specifically described with reference to FIG. 2. Specifically, the control unit 2 (the modules thereof) executes a program (algorithm) whose structure (procedure) is illustrated in FIG. 2.

The charging wire break determining module 23 sets the regulated-voltage command value determined by the target command setting module 20 as a regulated-voltage command variable VREG, and sets the current limit duty command value determined by the target command setting module 20 as a current limit duty command variable D in step S101.

Next, the determining module 23 sets the voltage of the battery 5 sensed (measured) by the corresponding sensor as a battery voltage variable VS, and sets the duty of the transistor 335 corresponding to the operating rate of the alternator 3 as a control duty variable Fduty in step S102.

Subsequently, the determining module 23 compares the battery voltage variable VS set in step S102 with a voltage threshold value obtained by subtracting the predetermined acceptable voltage drop $\Delta V$ from the regulated-voltage command value VREG in step S103. Note that the acceptable voltage drop ΔV shows an acceptable value of a voltage drop across the charging wire 4 when a current flows through the charging wire 4 from the alternator 3 to the battery 5. The acceptable voltage drop ΔV has been predetermined to, for example, 1.5 V.

In addition, in step S103, the determining module 23 compares the control duty variable Fduty set in step S102 with a duty threshold value obtained by subtracting the predetermining acceptable duty ΔD from the current limit duty command value D set in step S101. Note that the acceptable duty ΔD means a duty shift acceptable when performing the comparison in step S103. The duty threshold value determines the upper limit of the control duty variable Fduty corresponding to the duty of the transistor 335 (the operating rate of the alternator 3).

As a result of comparison in step S103, when the battery voltage variable VS is lower than the voltage threshold value, and the control duty variable Fduty is lower than the duty threshold value, in other words, when the equations given by VS<VREG−ΔV and Fduty<D−ΔD hold (the determination in step S103 is YES), the determining module 23 shifts to step S104.

In step S104, the determining module 23 determines that the operating rate of the alternator 3 has decreased although the voltage of the battery 5 has decreased, thereby deciding that the charging wire 4 is broken. In other words, the determining module 23 determines that power requirements of the electrical loads 6 and 7 have been reduced even though the voltage of the battery 5 has decreased, thereby deciding that the charging wire 4 is broken.

When determining that the charging wire 4 has a break, the target command value setting module 20 sets the regulated-voltage command value to a predetermined value that allows the alternator 3 and the electrical load 7 to be protected. For example, the setting module 20 sets the regulated-voltage command value to a predetermined value of 14.5 V. The predetermined value of 14.5 V is higher than the open-circuit voltage of the battery 5 of, for example, 12.8 V, and is equal to or lower than the maximum permissible voltage of each of the alternator 3 and the electrical loads 6 and 7 in step S104. The alarm control circuit 25 causes the warning device to audibly or visibly put out an alert to a driver of the vehicle in step S104.

In contrast, for example, after the operation in step S104, as a result of comparison in step S103, when the battery voltage variable VS is lower than the voltage threshold value, and the control duty variable Fduty is equal to or higher than the duty threshold value, in other words, when the equations given by VS<VREG−ΔV and Fduty≧D−ΔD hold (the determination in step S103 is NO), the determining module 23 shifts to step S105.

In step S105, the determining module 23 determines that the operating rate of the alternator 3 has increased with decrease of the voltage of the battery 5, thereby deciding that the charging wire 4 has no breaks. In other words, the determining module 23 determines that power requirements of the electrical loads 6 and 7 have increased with decrease of the voltage of the battery 5.

Similarly, as a result of comparison in step S103, when the battery voltage variable VS is equal to or higher than the voltage threshold value, even if the control duty variable Fduty is lower than the duty threshold value (the determination in step S103 is NO), the determining module 23 shifts to step S105. In step S105, the determining module 23 determines that the battery voltage has increased with decrease of the operating rate of the alternator 3, thereby deciding that the charging wire 4 has no breaks.

In step S105, when determining that the charging wire 4 has no breaks, the target command value setting module 20 resets the regulated-voltage command value to remove the protection of the alternator 3, thereby normally determining the regulated-voltage command value. The alarm control circuit 25 calls off the alert put out from the warning device.

More specifically, break finding operations of the charging wire break determining module 23 of the control unit 2 while the control unit 2 controls the alternator 3 such that the regulated-voltage command variable VREG is set to 14.5 V, and the current limit duty command variable D is set to 100% will be described.

When the charging line 4 is broken, the alternator 3 cannot charge the battery 5 so that the voltage of the battery 5 decreases up to approximately, for example, 12 V. The charging wire disconnection causes the alternator electrical load to be reduced, decreasing the operating rate of the alternator 3. The duty of the transistor 335 decreases up to approximately, for example, 7% with decrease of the alternator operating rate.

In step S103, therefore, because the equations given by VS<VREG−ΔV (12 V<14.5 V−1.5 V) and Fduty<D−ΔD (7%<100%−5%) hold, the determining module 23 determines that the charging wire 4 is broken.

Note that, in this specific example, when the charging wire is broken, the duty of the transistor 335 decreases up to approximately 7%. In this case, when the alternator rotor is driven at high speed, the duty of the transistor 335 further decreases. Even if there is provided the electrical load 7 direct connected to the alternator 3, because the duty merely increases no more than several tens of percents, the operations of the determining module 23 illustrated in FIG. 2 can determine whether the charging wire 4 is broken with accuracy.

In contrast, in this specific example, when the charging wire has no breaks, increase of the power requirements of the electrical load 6 and 7 decreases the voltage of the battery 5 up to approximately 12 V. In this case, decrease of the battery voltage increases the alternator electrical load, causing the operating rate of the alternator 3 to rise. The duty of the transistor 335 increases with rise of the operating rate of the alternator 3 so that it reaches 100%.

In step S103, therefore, because the equations given by VS<VREG−ΔV (12 V<14.5 V−1.5 V) and Fduty>D−ΔD (100%>100%−5%) hold, the determining module 23 determines that the charging wire 4 has no breaks.

In this specific example, the battery voltage decreases up to approximately 12 V with increase of power consumption of the electrical loads 6 and 7. When power requirements of the electrical loads 6 and 7 are maintained within the available power energy of the alternator 3, decrease of the battery voltage is limited, making it possible to prevent the battery voltage from decreasing from the voltage threshold value; this voltage threshold value is obtained by subtracting the acceptable voltage drop (ΔV) from the regulated-voltage command variable (VREG).

As described above, in the first embodiment, the battery charging system 1 is configured such that the alternator 3 is controlled based on the plurality of target command values communicated between the alternator 3 and the control unit 2. In such a configuration of the system 1, it is possible to determine that the charging wire 4 is broken when the battery voltage variable VS is lower than the voltage threshold value obtained by subtracting the acceptable voltage drop ΔV from the regulated-voltage command variable VREG and the control duty variable Fduty is lower tan the duty threshold value obtained by subtracting the predetermined acceptable duty ΔD from the current limit duty command variable D. This allows determination of whether the charging wire 4 is broken without using A/D converters required for the conventional determination using the voltage difference between the alternator output and the battery voltage. This allows the simple-structured charging system 1 to detect whether the charging wire 4 is broken.

Moreover, in the first embodiment, it is possible to compare the control duty variable Fduty with the duty threshold value obtained by subtracting the predetermined acceptable duty ΔD from the current limit duty command variable D. This allows reliable determination of whether the charging line 4 is broken while avoiding erroneous determination.

In the structure of the system 1 according to the first embodiment, providing the duty of the transistor 335 to the control unit 2 permits the control unit 2 to easily grasp the operating rate of the alternator 3.

Furthermore, when it is determined that the charging line 4 is broken, the regulated-voltage command value is set to a predetermined voltage that allows protection of the alternator 3 and the electrical load 7 directly connected thereto and continuously feed of power to the electrical load 7, and the disconnection of the charging wire 4 is alerted to the driver.

In the first embodiment, when the charging line 4 is determined to be broken, it is possible to set the regulated-voltage command value to be higher than the open circuit voltage of the battery 5 and to be equal to or lower than the maximum permissible voltage of, for example, the electrical load 7 directly connected to the alternator 3. This continues to determine that the charging line 4 is broken after determination of the break in the charging line 4, to protect the alternator 3 and the electrical load 7, and to alert the driver to the disconnection of the charging wire 4.

Second Embodiment

Figure 3:
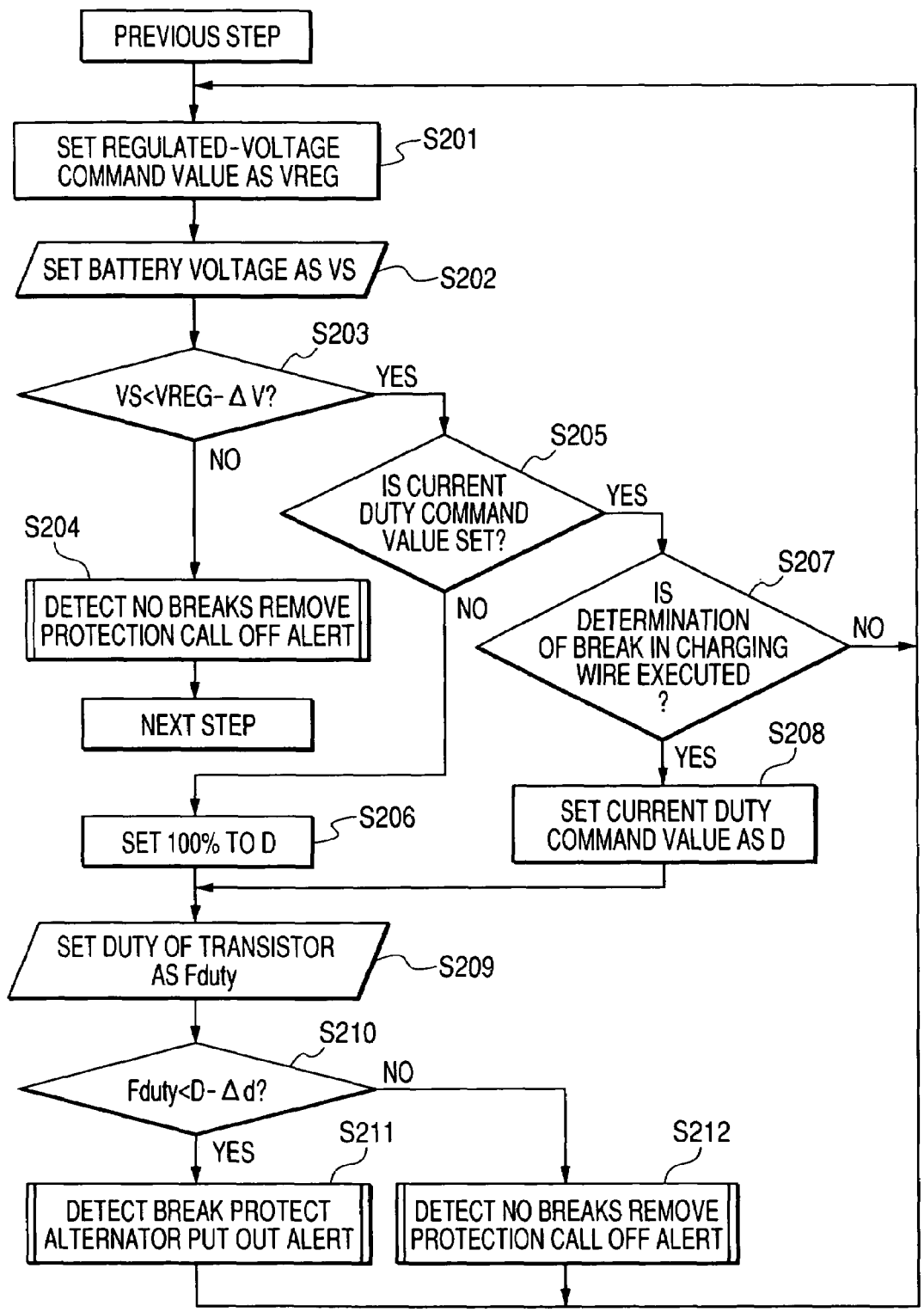
FIG. 3 is a flowchart schematically illustrating an example of operations of a battery charging system according to a second embodiment of the present invention.

An example of operations of a battery charging system according to a second embodiment to detect a break in the charging wire 4 is illustrated in FIG. 3. In the second embodiment, some of operations of the charging system according to the second embodiment, which are different from the operations of the charging system 1 according to the first embodiment, are mainly described. Descriptions of the same operations of the charging system according to the second embodiment as those of the charging system 1 are therefore omitted or simplified except when necessary. Note that elements of the charging system according to the second embodiment, which are substantially identical to those of the charging system 1 according to the first embodiment shown in FIG. 1, are represented by the same reference characters as in FIG. 1. The descriptions of the elements of the charging system according to the second embodiment are therefore omitted or simplified.

Break finding operations of the charging wire break determining module 23 of the control unit 2 will be specifically described with reference to FIG. 3. The control unit 2 (the modules thereof) executes a program (algorithm) whose structure (procedure) is illustrated in FIG. 3.

Referring to FIG. 3, after completion of an operation in a predetermined step in a predetermined program, the charging wire break determining module 23 of the control unit 2 sets the regulated-voltage command value determined by the target command setting module 20 as the regulated-voltage command variable VREG in step S201, and sets the voltage of the batter 5 sensed (measured) by the corresponding sensor as the battery voltage variable VS in step S202.

Next, in step S203, the determining module 23 compares the battery voltage variable VS set in step S202 with a voltage threshold value obtained by subtracting the predetermined acceptable voltage drop ΔV from the regulated-voltage command value VREG set in step S201.

As a result of comparison in step S203, when the battery voltage variable VS is equal to or higher than the voltage threshold value (VS≧VREG−ΔV) (the determination in step S203 is NO), the determining module 23 shifts to step S204.

In step S204, because a drop in the battery voltage is small, the defining module 23 determines tat the charging wire 4 has no breaks. In response to the determination of the module 23, the target command value setting module 20 removes the protection of the alternator 3 to normally determine the regulated-voltage command value, and calls off the alert put out from the warning device in cases where the aforementioned operation in step S211 has been already executed. Thereafter, the control unit 2 shifts to a step next to the predetermined step in the predetermined program.

In contrast, as a result of comparison in step S203, when the battery voltage variable VS is lower than the voltage threshold value (VS<VREG−ΔV) (the determination in step S203 is YES), the determining module 23 determines whether the current duty command value is set by the target command setting module 20 in step S205.

In step S205, it is determined that no current duty command value is set by the target command setting module 20 (the determination in step S205 is NO), the target command setting module 20 sets the current duty command value of 100% as a current duty command variable D in step S206.

In contrast, in step S205, it is determined that the current duty command value has been set by the target command setting module 20 (the determination in step S205 is YES), the target command setting module 20 determines whether to execute determination of a break in the charging wire 4 based on the current duty command value in step S207.

As a result of determination in step S207, when the current duty command value has not been temporarily set in order to, for example, reduce the engine load so that it is determined to execute determination of a break in the charging wire 4 (the determination in step S207 is YES), the target command setting module 20 shifts to step S208. In step S208, the target command setting module 20 sets the current duty command value determined thereby as the current duty command variable D.

On the contrary, when the current duty command value has been temporarily set in order to, for example, reduce the engine load so that it is determined not to execute determination of a break in the charge wire 4 because of avoiding erroneous determination (the determination in step S207 is NO), the target command setting module 20 returns to step S201.

When the current command variable D is set in step S206 or S208, the determining module 23 sets the duty of the transistor 335 corresponding to the operating rate of the alternator 3 extracted by the module 22 as a control duty variable Fduty in step S209.

Next, the determining module 23 compares the control duty variable Fduty with a duty threshold value obtained by subtracting the predetermined acceptable duty ΔD from the current limit duty command value D set in step S206 or S208 in step S210.

When the control duty variable Fduty is lower than the duty threshold value, in other words, when the equation given by Fduty<D−ΔD holds (the determination in step S210 is YES), the determining module 23 determines that the charging wire 4 is broken.

When determining that the charging wire 4 has a break, the setting module 20 sets the regulated-voltage command value to a predetermined value that allows the alternator 3 and the electrical load 7 to be protected. For example, the setting module 20 sets the regulated-voltage command value to a predetermined value of 14.5 V. The predetermined value of 14.5 V is higher than the open-circuit voltage of the battery 5 of, for example, 12.8 V, and is equal to or lower than the maximum permissible voltage of each of the alternator 3 and the electrical loads 6 and 7 in step S211. The alarm control circuit 25 causes the warning device to audibly or visibly put out an alert to the driver of the vehicle in step S211. Thereafter the module 23 returns to step S201.

In contrast, when the control duty variable Fduty is equal to or higher than the duty threshold value, in other words, when the equation given by Fduty≧D−ΔD holds (the determination in step S210 is NO), the determining module 23 determines that the charging wire 4 has no break.

In step S212, when determining that the charging wire 4 has no breaks, the target command value setting module 20 removes the protection of the alternator 3 to normally determine the regulated-voltage command value, and calls off the alert put out from the warning device in cases where the operation in step S211 has been already executed. Thereafter, the module 23 returns to step S201.

More specifically, break finding operations of the charging wire break determining module 23 of the control unit 2 while the control unit 2 controls the alternator 3 such that the regulated-voltage command variable VREG is set to 14.5 V will be described.

When the charging wire has no breaks, the battery voltage is kept to, for example, approximately 14 V. In this state, in step S203, because the equation given by VS>VREG−ΔV (14 V>14.5 V−1.5 V) holds, the determining module 23 determines that the charging wire 4 has no breaks.

In contrast, when the charging wire is broken and/or power requirements of the electrical load 6 and 7 increase, the voltage of the battery 5 decreases up to, for example, approximately 12 V. In this state, in step S203, because the equation given by VS<VREG−ΔV (12 V<14.5 V−1.5 V) holds, the determining module 23 determines that the charging wire 4 is broken, thereby determining whether the current duty command value is set by the target command setting module 20 in step S205.

In step S205, it is determined that no current duty command value is set by the target command setting module 20, the target command setting module 20 sets the current duty command value of 100% as the current duty command variable D, thereby executing the charging wire break destining operations in steps S209 and S210 similar in the first embodiment.

In contrast, when it is determined that the current duty command value is set by the target command setting module 20, in step S207, the target command setting module 20 determines whether to execute determination of a break in the charging wire 4 based on the current duty command value.

As a result of determination in step S207, when the current duty command value has been temporarily set in order to, for example, reduce the engine load so that it is determined not to execute determination of a break in the charging wire 4, the determining module 23 does not execute determination of a break in the charging wire 4, thereby avoiding erroneous determination. In addition, in this case, it is possible to avoid malfunctions of the alternator protection operations and the alarming operations. Specifically, when the current duty command value has been temporarily set in order to, for example, reduce the engine load, the determining module 23 may determine that the charging line 4 is broken although the charging line 4 has no breaks.

On the contrary, when the current duty command value has not been temporarily set in order to, for example, reduce the engine load, and have been set in order to constant limit the alternator output 3, the determining module 23 executes determination of a break in the charging wire 4.

For example, when the current duty command value is set to, for example, 70%, if the charging line 4 is broken, in step S210, because the equation given by Fduty<D−ΔD (7%<70%−5%) holds, the determining module 23 determined that the charging wire 4 is broken.

In contrast, when power requirements of the electrical loads 6 and 7 increase, in step S210, because the equation given by Fduty>D−ΔD (70%>70%−5%) holds, the determining module 23 determined that the charging wire 4 has no breaks.

As described above, in the second embodiment, it is possible to compare the control duty variable Fduty with the duty threshold value obtained by subtracting the predetermined acceptable duty ΔD from the current limit duty command value D after comparing the battery voltage variable VS with the voltage sold value obtained by subtracting the predetermined acceptable voltage drop ΔV from the regulated-voltage command value VREG. This can eliminate the need for comparison of the control duty variable Fduty with the duty threshold value when the battery voltage variable VS is equal to or higher than the voltage threshold value obtained by subtracting the predetermined acceptable voltage drop ΔV from the regulated-voltage command value VREG. This makes it possible to reduce the operation time of determination of whether the charging wire 4 is broken.

In addition, the second embodiment allows, when the control unit 2 temporarily sets the current duty command value in order to, for example, reduce the engine load, determination of whether the charging wire 4 is broken to be interrupted. This can avoid erroneous determination caused by limiting the duty of the transistor 335 for controlling the exciting current.

Third Embodiment

Figure 4:
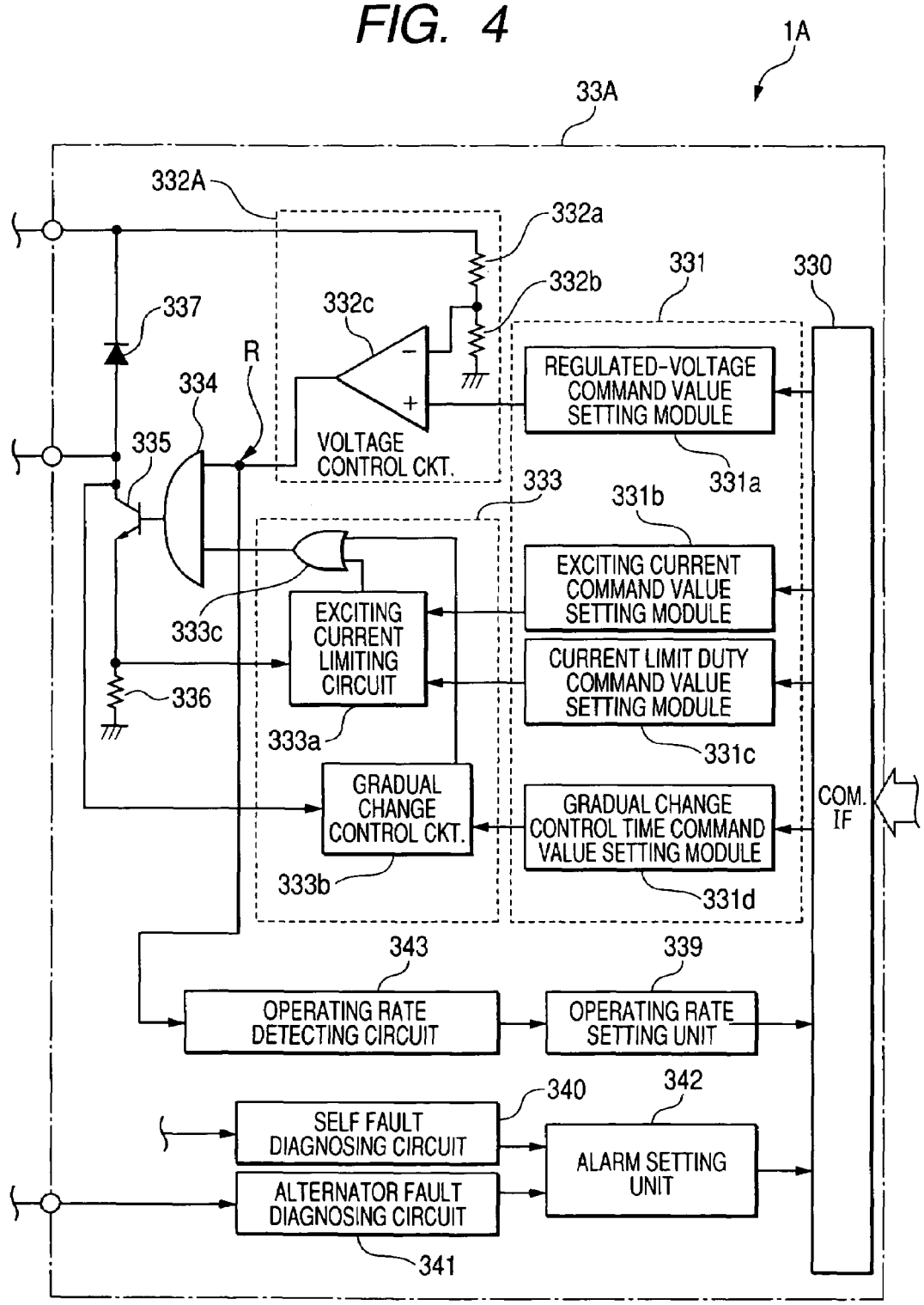
FIG. 4 is a circuit diagram schematics illustrating an example of the circuit structure of a battery charging system according to a third embodiment of the present invention.

An example of the circuit structure of a battery charging system 1A according to a third embodiment is illustrated in FIG. 4. In the third embodiment, some of elements and operations of the charging system 1A, which are different from the elements and operations of the charging system 1 according to the first and second embodiments, are mainly described. Descriptions of the same elements and operations of the charging system 1A as those of the charging system 1 are therefore omitted or simplified except when necessary. Note that elements of the charging system 1A, which are substantially identical to those of the charging system 1 shown in FIG. 1, are represented by the same reference characters as in FIG. 1. The descriptions of the elements of the charging system 1A are therefore omitted or simplified.

The battery charging system 1A includes a controller 33A, and the controller 33A is provided with a voltage control circuit 332A and an operating rate detecting circuit 343.

As illustrated in FIG. 4, the voltage control circuit 332A is configured to generate, based on the target voltage determined by the module 331a and the DC voltage output from the alternator 3, the voltage control signal (PWM signal) required to control the exciting current, thereby outputting the voltage control signal to the AND circuit 334.

Specifically, the voltage control circuit 332A is provided with a first resistor 332a, a second resistor 332b, and a comparator 332c. The first and second resistors 332a and 332b are connected in series. One end of the first resistor 332a is connected to the connection point P1 connecting between the charging line 4 and the rectifier 32. One end of the second resistor 332b is connected to the vehicle body to be grounded. The comparator 332c has an inverting input terminal, a non-inverting input terminal, and an output terminal. The inverting terminal is connected to a connection point between the first and second resistors 332a and 332b. The noninverting input terminal is connected to the regulated-voltage command value setting module 331a. The output terminal is connected to the AND circuit 334.

The operating rate detecting circuit 343 is configured to detect a duty of the transistor 335 that corresponds to the operating rate of the alternator 3 before being limited based on the current control signal.

The AND circuit 334 for generating the switching signal is operative to execute the logical AND operation of the voltage control signal outputted from the circuit 332A and the current control signal outputted from the circuit 333. The switching signal for the transistor 335 is therefore determined such that the voltage control signal is limited based on the current control signal. This causes the duty of the voltage control signal to be equivalent to the alternators operating rate before being limited based on the current control signal.

Specifically, the operating rate detecting circuit 343 is connected to a connection point R between the output terminal of the comparator 332c and the AND circuit 334. The operating rate detecting circuit 343 is designed to a simple-structured digital circuit, such as a counter, without using A/D converters, which is similar to the first embodiment.

Specifically, the comparator 332c is designed to generate, based on the target voltage determined by the module 331a and the DC voltage output from the alternator 3, a voltage control signal, such as a PWM signal, required to control the exciting current. The PWM signal consists of a train of pulses of high and low voltages at predetermined time intervals (periods) with a predetermined reference duty.

For example, the counter measures each period of the voltage control signal and a high level period during which the voltage control signal is in the high voltage level in each period of the voltage control signal. The counter also calculates, based on the measured values, the ratio of the high level period to each period of the voltage control signal as the reference duty of the transistor 335 expressed in percentage.

The operating rate setting unit 339 is operative to convert the reference duty of the transistor 335 corresponding to the operating rate of the alternator 3 before being limited based on the current control signal, which is detected by the operating rate detecting circuit 343, into an information code, thereby passing it to the communication interface 330. The information code meets the predetermined communication procedures between the alternator 3 and the control unit 2. The information code is sent to the control unit 2 through the communication interface 330.

Break finding operations of the charging wire break determining module 23 of the control unit 2 will be specifically described with reference to FIG. 5. The control unit 2 executes a program whose structure is illustrated in FIG. 5.

Figure 5:
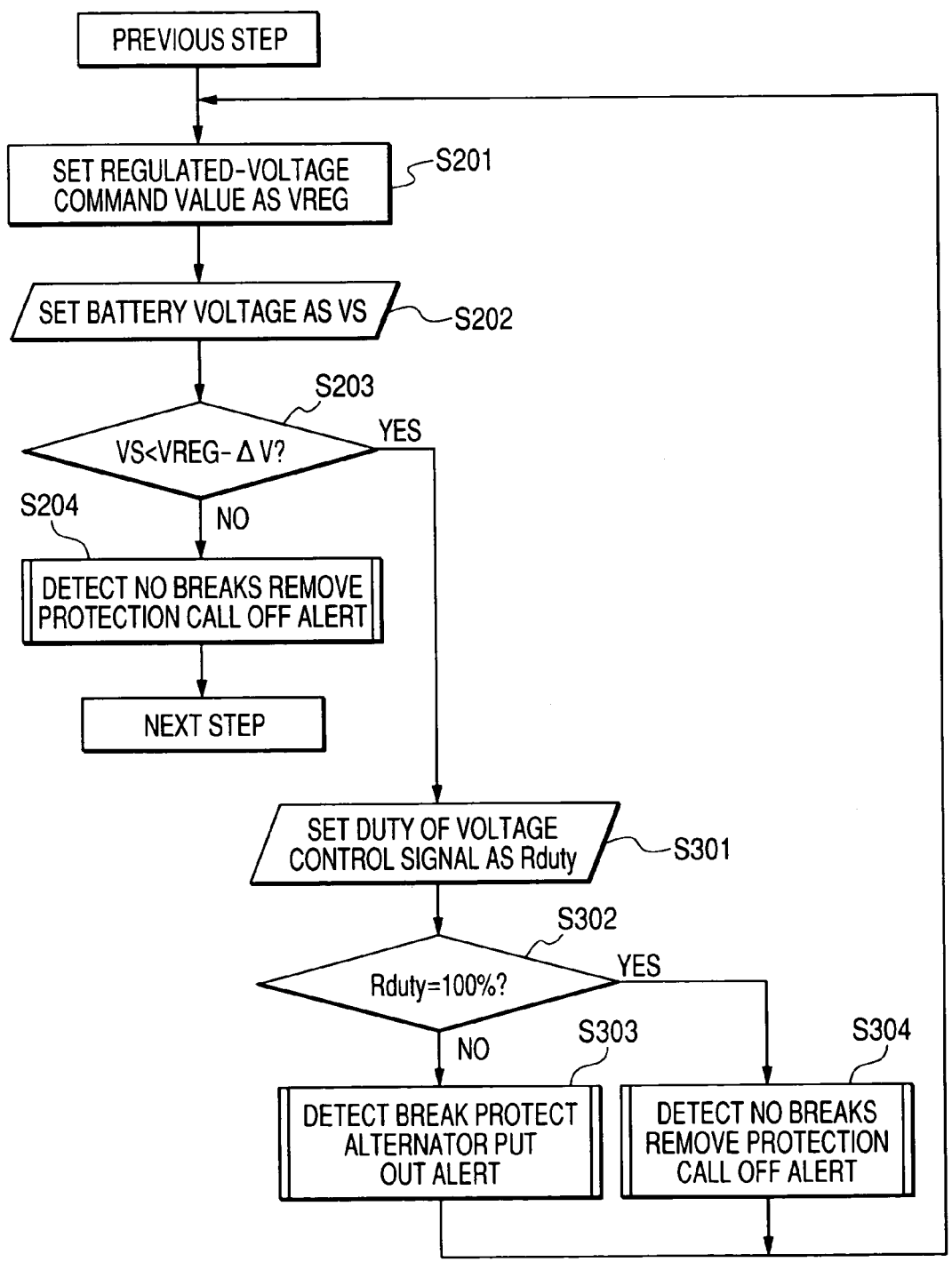
FIG. 5 is a flowchart schematically illustrating an example of operations of the battery charging system illustrated in FIG. 4.

Referring to FIG. 5, the operations of the target command setting module 20 or the determining module 23 in steps S201 to S204 have been already described in the second embodiment, so that the descriptions of which are omitted.

As a result of comparison in step S203, when the battery voltage variable VS is lower than the voltage threshold value (VS<VREG−ΔV) (the determination in step S203 is YES), the determining module 23 shifts to step S301. In step S301, the determining module 23 sets, as a voltage control duty variable Rduty, the reference duty of the voltage control signal corresponding to the operating rate of the alternator 3 before being limited based on the current control signal extracted by the operating rate setting module 23.

Next, the determining module 23 determines whether the voltage control duty variable Rduty is equal to 100% (operating rate threshold value) corresponding to cases where the maximum exciting current flows through the exciting winding 30 in step S302.

When it is determined that the voltage control duty variable Rduty is unequal to 100% (the determination in step S302 is NO), the controller 33 does not cause the maximum exciting current to flow through the exciting winding 30 even through the battery voltage decreases. The determining module 23 therefore determines that the charging wire 4 is broken.

When it is determined that the charging wire 4 is broken, the setting module 20 sets the regulated-voltage command value to a predetermined value that allows the alternator 3 and the electrical load 7 to be protected. For example, the setting module 20 sets the regulated-voltage command value to a predetermined value of 14.5 V. The predetermined value of 14.5 V is higher than the open-circuit voltage of the battery 5 of, for example, 12.8 V, and is equal to or lower than the maximum permissible voltage of each of the alternator 3 and the electrical loads 6 and 7 in step S303. The alarm control circuit 25 causes the warning device to audibly or visibly put out an alert to a driver of the vehicle in step S303. Thereafter, the module 23 shifts to step S201.

In contrast, when it is determined that the voltage control duty variable Rduty is equal to 100% (the determination in step S302 is YES), because the controller 33 tries to cause the maximum exciting current to flow through the exciting winding 30, the determining module 23 determines that the charging wire 4 has no breaks. In step S304, when determining that the charging wire 4 has no breaks, the target command value setting module 20 removes the protection of the alternator 3 to normally determine the regulated-voltage command value, and calls off the alert put out from the warning device in cases where the operation in step S303 has been already executed. Thereafter, the module 23 returns to step S201.

More specifically, break finding operations of the charging wire break determining module 23 of the control unit 2 while the control unit 2 controls the alternator 3 such that the regulated-voltage command variable VREG is set to 14.5 V will be described.

When the charging wire has no breaks, the battery voltage is kept to, for example, approximately 14 V. In this state, in step S203, because the equation given by VS>VREG−ΔV (14 V>14.5 V−1.5 V) holds, the determining module 23 determines that the charging wire 4 has no breaks.

In contrast, when the charging wire is broken and/or power requirements of the electrical load 6 and 7 increase, the voltage of the battery 5 decreases up to, for example, approximately 12 V. In this state, in step S203, because the equation given by VS<VREG−ΔV (12 V<14.5 V−1.5 V)

holds, the determining module 23 sets, as the voltage control duty variable Rduty, the reference duty of the voltage control signal.

The charging wire disconnection causes the alternator electrical load to be reduced. This eliminates the need for causing the maximum exciting current to flow through the exciting winding 30, decreasing the reference duty of the voltage control signal up to, for example, approximately 7%. In step S303, the decrease of the reference duty of the voltage control signal therefore causes the equation given by Rduty<100% (7%<100%) to hold, so that the determining module 23 determines that the charging line 4 is broken.

In contrast, when power requirements of the electrical loads 6 and 7 increase, the alternator electrical load to increase, so that the controller 33 tries to cause the maximum exciting current to flow through the exciting winding 30. This increases the reference duty of the voltage control signal up to 100%. In step S303, the increase of the reference duty of the voltage control signal therefore causes the equation given by Rduty=100% (100%=100%) to hold, so that the determining module 23 determines that the charging line 4 has no breaks.

As set forth above, in the third embodiment, the reference duty of the voltage control signal allows the operating rate of the alternator 3 to be easily known.

In addition, in the third embodiment, when the battery voltage is lower than the voltage threshold value, and the operating rate of the alternator 3 obtained based on the reference duty of the voltage control signal is lower than the predetermined operating rate threshold value, it is possible to determine that the charging line 4 is broken. This eliminates the need for determination using the current limit duty command value for controlling the operating rate of the alternator 3, which is sent from the controller 3. This allows simplification of the program executed by the control unit 2.

Specifically, when the battery voltage VS is lower than the voltage threshold value, and the reference duty Rduty of the voltage control signal corresponding to the operating rate of the alternator 3 before being limited based on the current control signal is lower than 100%, it is possible to determine that the charging line 4 is broken.

This permits the procedures (instructions) in the program to be omitted; these procedures are associated with the command values required to limit the exciting current, such as the exciting current command value, the current limit duty command value, the gradual change control time command value, and the like. This can simplify the program.

In each of the first to third embodiments, the charging wire break determining module 23 can use the exciting current command value in place of the current limit duty command value to determine whether the charging wire 4 is broken based on a predetermined acceptable voltage drop and an predetermined acceptable exciting current.

Fourth Embodiment

A battery charging system according to a fourth embodiment of the present invention is designed to control the alternator output based on driving states of the vehicle. Specifically, the battery charging system is designed to decrease the alternator output under acceleration, and to increase it during deceleration. This allows the engine load by the alternator to decrease, enhancing the engine with low fuel consumption.

In addition, the battery charging system according to the fourth embodiment is designed to regulate the alternator output so that a calculation of battery input and output currents over time approaches a predetermined target value when the engine runs at idle or at a constant speed.

Figure 6:
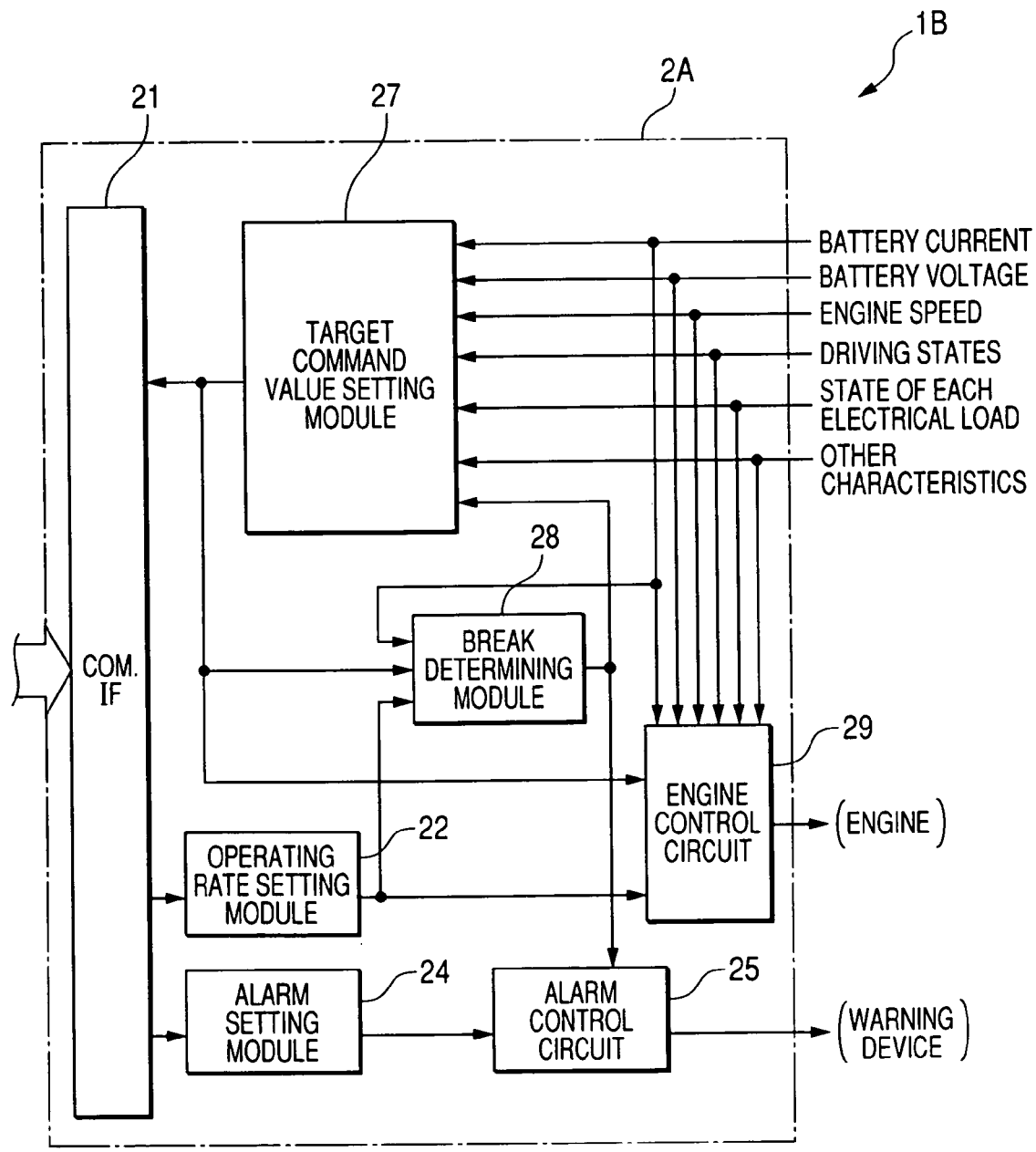
FIG. 6 is a circuit diagram schematically illustrating an example of the circuit structure of a battery charging system according to a fourth embodiment of the present invention.
Figure 7:
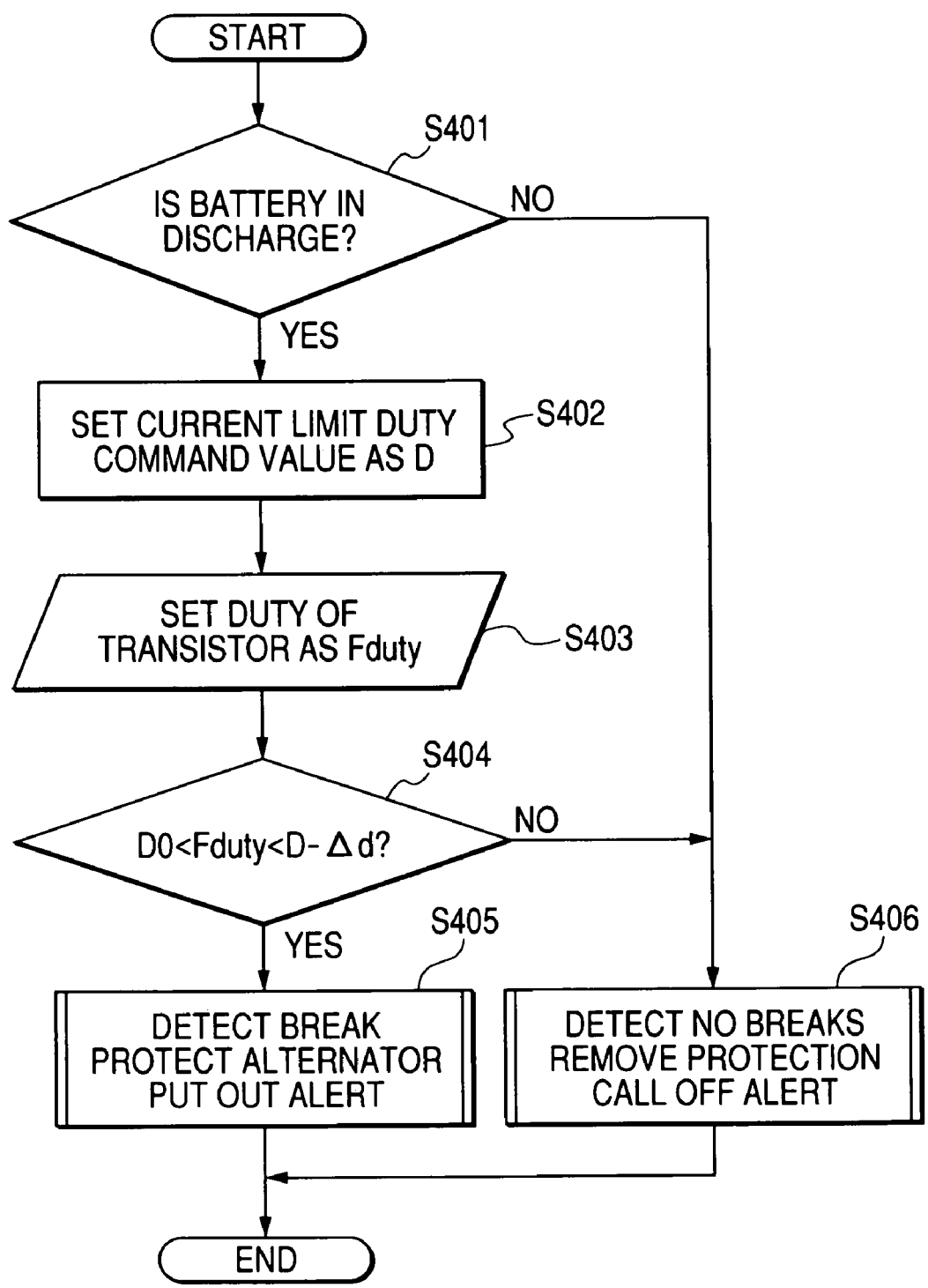
FIG. 7 is a flowchart schematically illustrating an example of operations of the battery charging system illustrated in FIG. 6.

An example of the circuit structure of the battery charging system 1B according to the fourth embodiment is illustrated in FIG. 6, and an example of operations of the battery charging system 1B to detect a break in the charging wire 4 is illustrated in FIG. 7. As compared with the battery charging system 1 according to the first embodiment, the battery charging system 1B is configured to control the alternator 3 based on a charging/discharging battery current in addition to the command values described in the first embodiment.

In the fourth embodiment, some of elements and operations of the charging system 1B, which are different from the elements and operations of the charging system 1 according to the first embodiment, are mainly described. Descriptions of the same elements and operations of the charging system 1B as those of the charging system 1 are therefore omitted or simplified except when necessary. Note that elements of the charging system 1B, which are substantially identical to those of the charging system 1 shown in FIG. 1, are represented by the same reference characters as in FIG. 1. The descriptions of the elements of the charging system 1B are therefore omitted or simplified.

The battery system 1B includes an external control unit 2A, and the external control unit 2A includes a target command value setting module 27, a communication interface 21, an operating rate setting module 22, a charging wire break determining module 28, an alarm setting module 24, an alarm control circuit 25, and an engine control circuit 29.

The target command setting module 27 is operative to compare the characteristics of the vehicle and each of the electrical loads 6 and 7 with predetermined reference values and to determine a plurality of target command values required to control the alternator 3 based on the compared results and on data indicative of whether the charging wire 4 is broken.

In addition to the target command values described in the first embodiment, the target command values includes a battery charge interrupting command value required to cause the alternator output to be lower than the battery voltage, thereby interrupting the battery charging.

The target command value setting module 27 is also operative to convert the plurality of target command values into information codes that meets the predetermined communication procedures between the alternator 3 and the external control unit 2A, thereby passing the converted target command values to the communication interface 21. The target command value setting module 27 is further operative to pass the regulated-voltage command value and the current limit duty command value to the charging wire break determining module 28, and to pass the plurality of target command values to the engine control circuit 29.

The operating rate setting module 22 is operate to extract the operating rate of the alternator 3 from the information codes received by the communication interface 21; this extracted operating rate of the alternator 3 is detected by the operating rate detecting circuit 338 described hereinafter. The operating rate setting module 22 is also operative to pass the extracted operating rate of the alternator 3 to the charging wire break determining module 28 and the engine control circuit 29.

The charging wire break determining module 28 is operative to determine whether the charging wire 4 is broken based on a charging/discharging battery current, a predetermined reference current value, the operating rate set by the module 22, a predetermined duty, and an acceptable duty, and the regulated-voltage command value determined by the module 27.

The engine control circuit 29 is configured to control the engine based on the characteristics of the vehicle and each of the electrical loads 6 and 7, the plurality of target command values set by the target command value setting module 20, and the operating rate determined by the operating rate setting module 22. The characteristics includes the engine speed, the driving states, and the state of each of the loads 6 and 7.

Next, break finding operations of the charging wire break determining module 28 of the control unit 2A will be specifically described with reference to FIG. 7. Specifically, the control unit 2A (the modules thereof) executes a program whose structure is illustrated in FIG. 7.

As illustrated in FIG. 7, the determining module 28 determines whether the battery 5 is in discharge in step S401. Specifically, the determining module 28 compares the charging/discharging battery current value with a predetermined reference current value, such as 0 A, referred to also as a threshold current value.

When the battery 5 shifts from the charge state to the discharge state, the charging battery current flowing into the battery 5 decreases so that the discharging battery current flows out thereof. Comparison of the charging/discharging battery current value with the reference current value allows determination of the discharging state of the battery 5. More particularly, the determining module 28 determines that the battery 5 is in discharge state when the charging/discharging battery current is lower than the reference current value.

Note that transient charging and discharging battery currents caused by alternator's output-current delay in response when turning on and off of each of the electrical loads 6 and 7 can be removed by, for example, a filter so that the determining module 28 can compare a constant charging/discharging battery current value with the reference current value.

When the battery 5 is in a fully charged condition, the battery current flowing into the battery 5 is a slight charging current. In this case, the reference current value can be set to a value smaller than 0 A, such as −5 A corresponding to the discharging current of 5 A. Note that a current sensor for measuring the battery charging/discharging current has a transient delay in response. For this reason, while the battery 5 shifts from the charging sate to the discharging state, even if the charging/discharging battery current decreases up to 0 V, the current sensor does not output 0 A, but outputs a value higher than the 0 A. The reference current value can be set to a value higher than the 0 A in view of the current sensor's delay in response.

When the battery 5 is in discharge state (the determination in step S401 is YES), the determining module 28 sets the current limit duty command value set by the target command value setting module 27 as the limit duty variable D in step S402. Next, the determining module 28 sets the duty of the transistor 335 corresponding to the operating rate of the alternator 3, which is extracted by the module 22, as the control duty variable Fduty in step S403.

Subsequently, in step S404, the determining module 28 compares the control duty variable Fduty set in step S403 with the predetermined duty (operating rate lower limit threshold value) D0, and with a duty threshold value (operating rate upper limit threshold value) obtained by subtracting the predetermined acceptable duty ΔD from the limit duty variable D set in step S402. Note that the duty D0 is set to be higher than the operating rate of the alternator 3 corresponding to the battery charge interrupting command value. Specifically, the duty D0 can be set to be higher than the duty of the transistor 335 corresponding to the battery charge interrupting command value.

When the battery charge interrupting command value causes the alternator output to become 0 V, in other words, the duty of the transistor 335 to become 0%, the duty D0 is set to, for example, 1%. The battery charge interrupting command value indicates that the alternator output is lower than the battery voltage, thereby interrupting the battery charging. The battery charge interrupting command not necessary causes the alternator output to become 0 V.

When the battery charge interrupting command value causes the alternator output to be higher than 0 V, the duty of the transistor 335 is also higher than 0%. In this case, the duty D0 is set to, for example, higher than 1%. To sum up, the duty D0 is set to be higher than the duty of the transistor 335. In addition, the acceptable duty ΔD means a duty shift acceptable when performing the comparison in step S404.

As a result of comparison in step S404, when the control duty variable Fduty is higher than the duty D0 and lower than the duty threshold value obtained by subtracting the predetermined acceptable duty ΔD from the limit duty variable D, in other words, when the equation given by D0<Fduty<D−ΔD holds (the determination in step S404 is YES), because the operating rate of the alternator 3 cannot be taken within a predetermined range under normal operating conditions even if the battery 5 is in discharge state, the determining module 28 determines that the charging wire 4 is broken.

When determining that the charging wire 4 has a break, the target command value setting module 27 sets the regulated-voltage command value to a predetermined value that allows the alternator 3 and the electrical load 7 to be protected. For example, the setting module 27 sets the regulated-voltage command value to a predetermined value of 14.5 V. The predetermined value of 14.5 V is higher than the open circuit voltage of the battery 5 of, for example, 12.8 V, and is equal to or lower than the maximum permissible voltage of each of the alternator 3 and the electrical loads 6 and 7 in step S405. The alarm control circuit 25 causes the warning device to audibly or visibly put out an alert to a driver of the vehicle in step S405.

In contrast, when the battery 5 is not in discharge state (the determination in step S401 is NO), because the battery 5 is in charge state, the determining module 28 determines that the charging wire 4 has no breaks.

Moreover, as a result of comparison in step S404, when the control duty variable Fduty is equal to or lower than the duty D0 or equal to or higher than the duty threshold value obtained by subtracting the predetermined acceptable duty, ΔD from the limit duty variable D, in other words, when the equations given by Fduty≦D0 and Fduty≧D−ΔD hold (the determination in step S404 is NO), because t the battery 5 is in discharge state and the operating rate of the alternator 3 is taken within the predetermined range under normal operating conditions, the determining module 28 determines that the charging wire 4 has no breaks.

Specifically, when the control duty variable Fduty is equal to or lower than the duty D0 (Fduty≦D0), the determining module 28 determines that the charging wire 4 has normal state in which the battery charge is interrupted by the battery charge interrupting command value so that the battery 5 is in discharge state. In addition, when the control duty variable Fduty is equal to or higher than the duty threshold value obtained by subtracting the predetermined acceptable duty ΔD from the limit duty variable D (Fduty≧D−ΔD), the determining module 28 determines that the charging wire 4 has normal state in which the battery 5 is in charge state although power requirements of the electrical loads 6 and 7 increase to exceed the power generation capacity of the alternator 3 so that the operating rate of the alternator 3 reaches its peak.

When determining that the charging wire 4 has normal state (no breaks), the target command value setting module 27 removes the protection of the alternator 3, thereby normally determining the regulated-voltage command value. The alarm control circuit 25 calls off the alert put out from the warning device in step S406.

More specifically, break finding operations of the charging wire break determining module 28 of the control unit 2A while the control unit 2A controls the alternator 3 such that the regulated-voltage command value is set to 14.5 V, and the current limit duty command variable D is set to 100% will be described.

When the charging line 4 is broken, the battery 5 is not charged by the alternator 3. The battery 5 supplies power to the electrical load 6 so that it is in discharge state. The charging wire disconnection causes the alternator electrical load to decrease, reducing the operating rate of the alternator 3. The duty of the transistor 335 decreases up to approximately, for example, 7% with decrease of the alternator operating rate.

In step S404, therefore, because D0<Fduty<D−ΔD (0%<7%<100%−5%) holds, the determining module 28 determines that the charging wire 4 is broken.

Not that, in this particular example, when the charging wire is broken, the duty of the transistor 335 decreases up to approximately 7%. In this case, when the alternator rotor is driven at high speed, the duty of the transistor 335 further decreases. Even if there is provided the electrical load 7 directly connected to the alternator 3, because the duty merely increases no more than several tens of percents, the operations of the determining module 28 illustrated in FIG. 6 can determine whether the charging wire 4 is broken with accuracy.

In contrast, when the charging wire has no breaks, when the power requirements of the electrical load 6 and 7 increases to exceed the power generation capacity of the alternator 3, the battery 5 shifts from the charge state to the discharge state for discharging power to each of the electrical loads 6 and 7. This causes the operating rate of the alternator 3 to reach its peak level, which also causes the duty of the transistor 335 to reach 100%.

In step 404, therefore, because Fduty>D−ΔD (100%>100%−5%) holds, the determining module 28 determines that the charging wire 4 has no breaks.

In addition, during vehicle acceleration, the battery charge interrupting command value allows the alternator 3 to interrupt the battery charging. The battery 5 shifts to the discharge state for supplying power to the electrical loads 6 and 7. In this state, the alternator 3 stops generation of power so that the duty of the transistor 335 becomes 0%. In step S404, therefore, because the D0=Fduty (0%=0%) holds, the determining module 28 determines that the charging wire 4 has no breaks.

As described above, in the fourth embodiment, the battery charging system 1B is configured such that the alternator 3 is controlled based on the plurality of target command values communicated between the alternator 3 and the control unit 2A. In such a configuration of the system 1B, it is possible to determine that the charging wire 4 is broken when the battery 5 is in discharge state, and the control duty variable Fduty is higher than the duty D0 and lower than the duty threshold value obtained by subtracting the predetermined acceptable duty ΔD from the current limit duty command variable D. This allows determination of whether the charging wire 4 is broken without using A/D converters required for the conventional determination using the voltage difference between the alternator output and the battery voltage. This allows the simple-structured charging system 1B to detect whether the charging wire 4 is broken.

Moreover, in the fourth embodiment, it is possible to securely determine whether the battery 5 is in charge state by comparing the charging/discharging battery current with the reference current value.

In the fourth embodiment, it is possible to compare the control duty variable Fduty with the duty D0 and with the duty threshold value obtained by subtracting the predetermined acceptable duty ΔD from the current limit duty command variable D. This allows the operating rate of the alternator 3, which cannot be taken within the predetermined range under normal operating conditions while the battery 5 is in discharge state, to be securely determined. Even if the operating rate of the alternator 3 is limited to the operating rate limit range or the battery charge is interrupted, it is possible to reliably determine whether the charging line 4 is broken while avoiding erroneous determination.

In the fourth embodiment, it is possible to compare the control duty variable Fduty with the duty threshold value obtained by subtracting the predetermine acceptable duty ΔD from the current limit duty command value D after comparing the charging/discharging battery current with the reference current value. This can eliminate the need for comparison of the control duty variable Fduty with the duty threshold value when the battery 5 is in charge state. This makes it possible to reduce the operation time of determination of whether the charging wire 4 is broken.

In the fourth embodiment, the duty of the transistor 335 corresponding to the conductivity thereof allows the operating rate of the alternator 3 to be easily known.

In the fourth embodiment, when it is determined that the cling line 4 is broken, the regulated-voltage command value is set to a predetermined voltage that allows protection of the alternator 3 and the electrical load 7 directly connected thereto and continuously feed of power to the electrical load 7, and the disconnection of the changing wire 4 is alerted to the driver.

In the fourth embodiment, when the charging line 4 is determined to be broken, it is possible to set the regulated-voltage command value to be higher than the open circuit voltage of the battery 5 and to be equal to or lower than the maximum permissible voltage of, for example, the electrical load 7 directly connected to the alternator 3. This continues to determine that the charging line 4 is broken after determination of the break in the charging line 4, to protect the alternator 3 and the electrical load 7, and to alert the driver to the disconnection of the charging wire 4.

Fifth Embodiment

Figure 8:
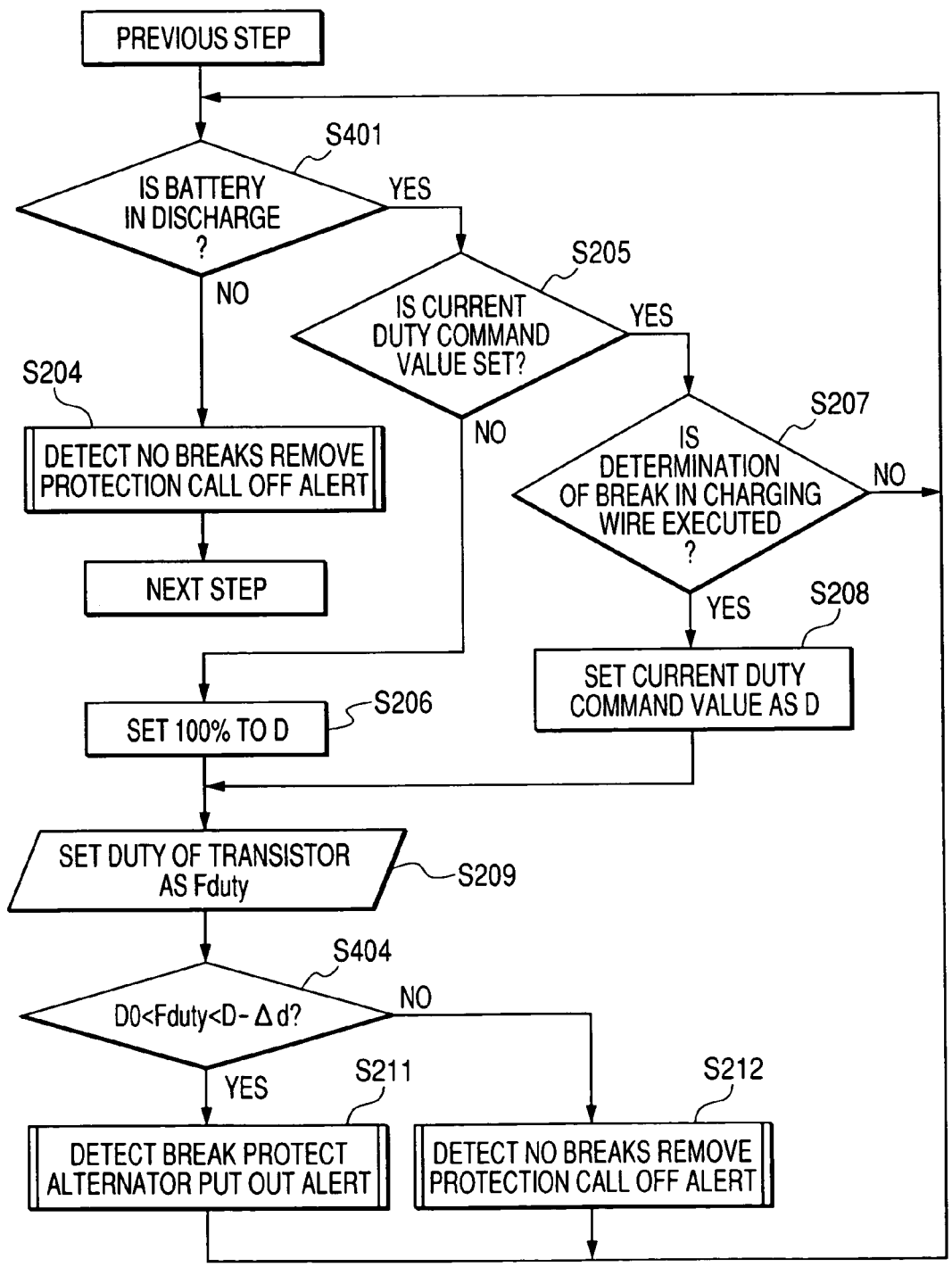
FIG. 8 is a flowchart schematically a illustrating an example of operations of a battery charging system according to a fifth embodiment of the present invention.

An example of operations of a battery charging system according to a fifth embodiment to detect a break in the charging wire 4 is illustrated in FIG. 8. In the fifth embodiment, some of operations of the charging system according to the fifth embodiment, which are different from the operations of the charging system 1B according to the fourth embodiment, are mainly described. Descriptions of the same operations of the charging system according to the fifth embodiment as those of the charging system 1B are therefore omitted or simplified except when necessary. Note that elements of the charging system according to the fifth embodiment, which are substantially identical to those of the charging system 1B according to the fourth embodiment shown in FIG. 6, are represented by the same reference characters as in FIG. 6. The descriptions of the elements of the charging system according to the fifth embodiment are therefore omitted or simplified.

Break finding operations of the charging wire break determining module 23 of the control unit 2A will be specifically described with reference to FIG. 8. The control unit 2A executes a program whose structure is illustrated in FIG. 8.

The determination operations according to the fifth embodiment are designed such that, in the determination operations according to the second embodiment, the operations in steps S201 to S203 are replaced into the operation in step S401 according to the fourth embodiment. Similarly, the operation in step S210 is replaced into the operation in step S404 according to the fourth embodiment.

In the fifth embodiment, the operations in step S401 and S404 of the charging system are mainly described so that descriptions of the other operations in steps S204 to S209, S211, and S212, which have been described in the second embodiment, are therefore omitted or simplified except when necessary.

As illustrated in FIG. 8, the determining module 28 determines whether the battery 5 is in discharge in step S401. When the battery 5 is in discharge state (the determination in step S401 is YES), the determining module 28 executes the operations in steps S205 and thereafter. When the operation in step S209 is executed, in step S404, the determining module 28 compares the control duty variable Fduty set in step S209 with the predetermined duty D0, and with the duty threshold value obtained by subtracting the predetermined acceptable duty ΔD from the limit duty variable D set in step S206 or S208.

In step S404, when the control duty variable Fduty is higher than the duty D0 and lower than the duty threshold value obtained by subtracting the predetermined acceptable duty ΔD from the limit duty variable D, in other words, when the equation given by D0<Fduty<D−ΔD holds (the determination in step S404 is YES), because the operating rate of the alternator 3 cannot be taken within a predetermined range under normal operating conditions even if the battery 5 is in discharge state, the determining module 28 determines that the charging wire 4 is broken, thereby executing the operation in step S211.

In contrast, in step S404, when the control duty variable Fduty is equal to or lower than the duty D0 or equal to or higher than the duty threshold value obtained by subtracting the predetermined acceptable duty ΔD from the limit duty variable D, in other words, when the equations given by Fduty≦D0 and Fduty≧D−ΔD hold (the determination in step S404 is NO), because t the battery 5 is in discharge state and the operating rate of the alternator 3 is taken within the predetermined range under normal operating conditions, the determining module 28 determines that the charging wire 4 has no breaks, thereby executing the operations in step S212.

On the other hand, in step S401, the battery 5 is not in discharge state (the determination in step S401 is NO), because the battery 5 is charged by the alternator 3, the determining module 28 determines that the charging wire 4 has no breaks, thereby shifting to the operation in step S204 to execute it.

As described above, in the fifth embodiment, when determining whether the charging wire 4 is broken based on the charging/discharging battery current and the control duty variable Fduty, and, when the control unit 2 temporarily sets the limit duty command value in order to reduce the engine load, it is possible to interrupt determination of whether the charging wire 4 is broken. This can avoid erroneous determination caused by limiting the duty of the transistor 335 for controlling the exciting current.

Sixth Embodiment

Figure 9:
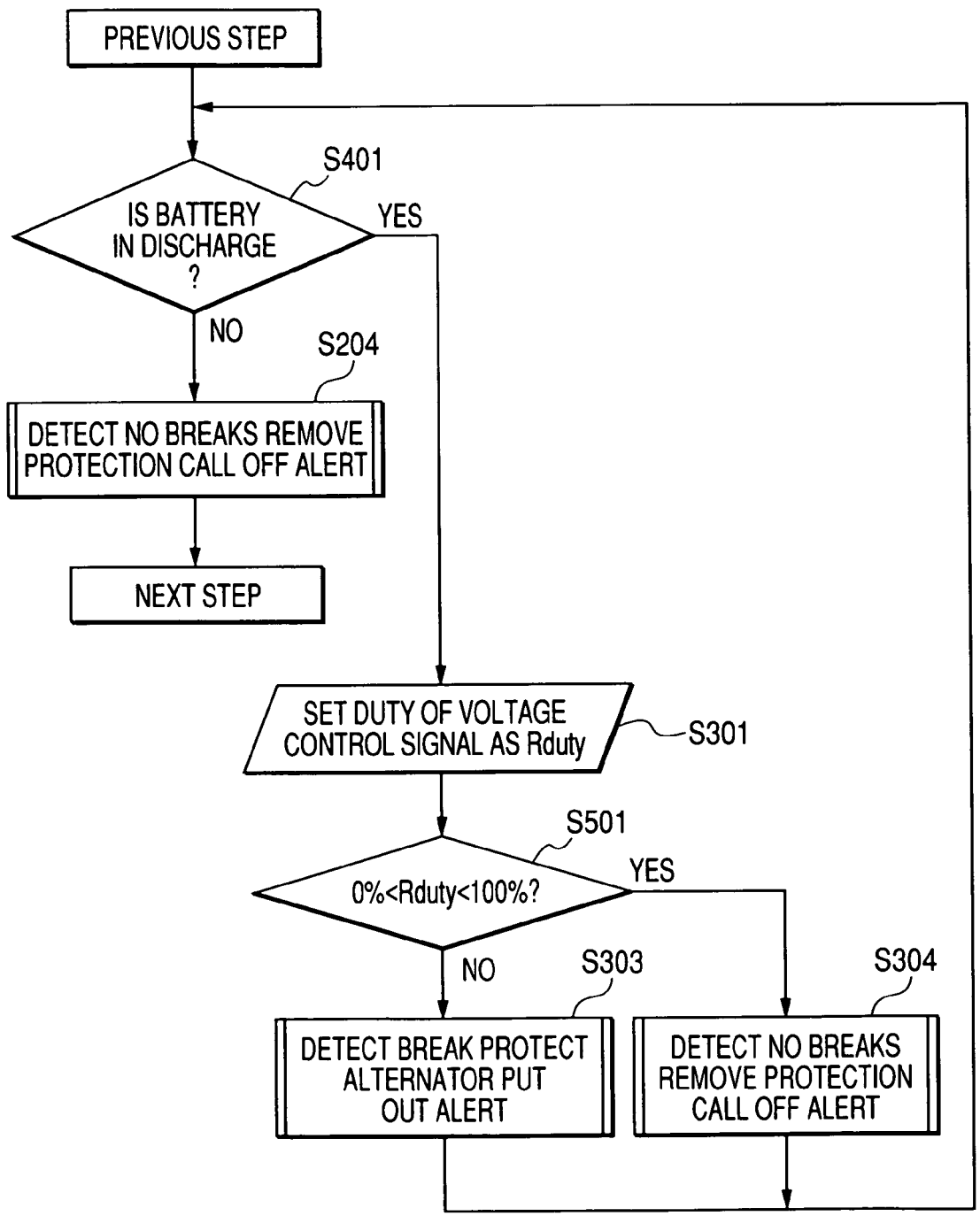
FIG. 9 is a flowchart schematically illustrating an example of operations of a battery charging system according to a sixth embodiment of the present invention.

An example of operations of a battery charging system according to a sixth embodiment to detect a break in the charging wire 4 is illustrated in FIG. 9. In the sixth embodiment, some of operations of the charging systems according to the fourth and fifth embodiments, which are different from the operations of the charging system 1B according to the fourth and fifth embodiments, are mainly described. Descriptions of the same operations of the charging system according to the sixth embodiment as those of the charging system 1B are therefore omitted or simplified except when necessary. Note that elements of the charging system according to the sixth embodiment, which are substantially identical to those of the charging system 1B according to the fourth embodiment are represented by the same reference characters as in FIG. 6. The descriptions of the elements of the charging system according to the sixth embodiment are therefore omitted or simplified.

Break finding operations of the charging wire break determining module 23 of the control unit 2A will be specifically described with reference to FIG. 9. The control unit 2A executes a program whose structure is illustrated in FIG. 9.

The determination operations according to the sixth embodiment are designed such that, in the determination operations according to the third embodiment, the operations in steps S201 to S203 are replaced into the operation in step S401 according to the fourth embodiment Similarly, the operation in step S302 is replaced into the operation in step S501 described hereinafter.

In the sixth embodiment, the operations in step S401 and S501 of the charging system are mainly described so that descriptions of the other operations in steps S204, S301, S303, and S304, which have been described in the third embodiment, are therefore omitted or simplified except when necessary.

As illustrated in FIG. 9, the determining module 28 determines whether the battery 5 is in discharge in step S401. When the battery 5 is in discharge state (the determination in step S401 is YES), the determining module 28 executes the operation in steps S301.

When the operation in step S301 is executed, in step S501, the determining module 28 compares the voltage control duty variable Rduty set in step S301 with:

0% (lower limit of the operating rate) corresponding to cases of interrupting the exciting current through the exciting winding 30; and 100% (upper limit of the operating rate) corresponding to cases of causing the maximum exciting current to flow through the exciting winding 30.

In step S501, when the voltage control duty variable Rduty is higher than 0% and lower than 100%, in other words, when the equation given by 0%<Fduty<100% holds (the determination in step S501 is YES), because the operating rate of the alternator 3 cannot be taken within a predetermined range under normal operating conditions even if the battery 5 is in discharge state, the determining module 28 determines that the charging wire 4 is broken. Thereafter, the determining module 28 executes the operation in step S303.

In contrast, in step S501, when the voltage control duty variable Rduty is equal to 0% or 100%, because the operating rate of the alternator 3 can be taken within a predetermined range under normal operating conditions even if the battery 5 is in discharge state, the determining module 28 determines that the charging wire 4 has no breaks. Thereafter, the determining module 28 executes the operation in step S304.

In step S401, the battery 5 is not in discharge state (the determination in step S401 is NO), because the battery 5 is charged by the alternator 3, the determining module 28 determines that the charging wire 4 has no breaks, thereby shifting to the operation in step S204 to execute it.

As described above, in the sixth embodiment, when the battery 5 is in charge state and the operating rate Rduty of the alternator 3 is within the predetermined range from 0% to 100% (0%<Rduty<100%), it is possible to determine that the charging line 4 is broken. This eliminates the need for determination using the procedures (instructions) in the program; these procedures are associated with the command values required to limit the exciting current, such as the exciting current command value, the current limit duty command value, the gradual change control time command value, and the like. This permits the program to be simplified.

In each of the battery charging systems according to the first to sixth embodiments, after the control unit 2 has started to operate, the control unit 2 determines whether the charging cable 4 is broken. If the charging wire 4 is broken before each of the battery charging systems starts to operate, it is possible to determine whether the charging cable 4 is broken using known determination methods. For example, it is possible to check whether to detect the presence or absence of a response sent from the alternator.

Moreover, the charging wire break determining module can be provided externally from the control unit.

In each of the embodiments and their modifications, each of the battery charging systems is installed in a vehicle, but each of the battery charging systems can be applied to other mechanisms.

In each of the embodiments and their modifications, as one example of generators, an alternator is used for charging the battery, but other types of generators can be applied for charging the battery.

In each of the embodiments and their modifications, the NPN bipolar transistor 335 is used to control the exciting current, but another type of transistors, such as NMOSFET, each of which is configured to control its conductivity with respect to the exciting current, can be used.

In each of the embodiments and their modifications, as one example of generators, an alternator is used for charging the battery, but other types of generators can be applied for charging the battery.

While there has been described what is at present considered to be these embodiments and modifications of the present invention, it will be understood that various modifications which are not described yet may be made therein, and it is intended to cover in the appended claims all such modifications as fall within the true spirit and scope of the invention.

What is claimed is:

1. A method of determining whether a charging wire connecting between a battery and a generator is broken, in which the generator is configured to charge the battery through the charging wire, the method comprising:
   measuring a voltage of the battery;
   detecting an operating rate of the generator; and
   determining that the charging wire is broken when the measured battery voltage is lower than a predetermined threshold voltage and the detected operating rate of the generator is lower than a predetermined threshold value.

2. A method according to claim 1, wherein the generator includes a conductivity control element and outputs a voltage created by magnetic fluxes, the magnetic fluxes being generated in the generator based on an exciting current, the exciting current being supplied to the generator through the control element such that the control element controls its conductivity with respect to the exciting current based on a plurality of command values, the plurality of command values including a first command value determining an upper limit of the operating rate, and wherein the predetermined threshold value is lower than the first command value.

3. A method according to claim 1, further comprising:
   comparing the measured battery voltage with the threshold voltage; and
   comparing the detected operating rate of the generator with the threshold value after the comparison of the battery voltage with the threshold voltage, wherein the determining step determines that the charging wire is broken based on the compared results of the comparing steps.

4. A method according to claim 2, further comprising interrupting the determining of the charging wire based on the first command value.

5. A method according to claim 2, wherein the operating rate is equivalent to the conductivity of the control element with respect to the exciting current.

6. A method according to claim 2, wherein the plurality of command values include a second command value used to determine the output voltage of the generator, the conductivity of the control element is controlled based on a voltage control signal composed of a train of pulses of high and low voltage levels at predetermined periods with a reference duty in each period, the reference duty being determined based on comparison of the second command value with the output voltage of the generator, and wherein the operating rate of the generator is equivalent to the reference duty of the voltage control signal.

7. A method of determining whether a charging wire connecting between a battery and a generator is broken, in which the generator is configured to charge the battery through the charging wire, the method comprising:
   determining whether the battery is in discharge;
   detecting an operating rate of the generator; and
   determining that the charging wire is broken when it is determined that the battery is in discharge and the detected operating rate is within a predetermined range, the predetermined range being determined by a first upper limit threshold value and a lower limit threshold value.

8. A method according to claim 7, wherein the generator includes a conductivity control element and outputs a voltage created by magnetic fluxes, the magnetic fluxes being generated in the generator based on an exciting current, the exciting current being supplied to the generator through the control element such that the control element controls its conductivity with respect to the exciting current based on a plurality of command values.

9. A method according to claim 7, wherein the determining whether the battery is in discharge includes comparing a current of the battery with a predetermined threshold current value, and determining the battery is in discharge based on the compared result.

10. A method according to claim 8, wherein the plurality of command values include a first command value allowing the generator to change the output voltage thereof to be lower than the battery voltage, and a second command value determining the upper limit threshold value, the upper limit threshold value is lower than the second command value, and the lower limit threshold value is higher than an operating rate corresponding to the first command value.

11. A method according to claim 9, wherein the determining that the charging wire is broken includes:
comparing the detected operating rate with the upper and lower limit threshold values after the comparison of the current of the battery with the predetermined threshold current value; and
determining whether the detected operating rate is within the predetermined range based on the compared result.

12. A method according to claim 10, further comprising interrupting the determining of the charging wire based on the second command value.

13. A method according to claim 8, wherein the operating rate is equivalent to the conductivity of the control element with respect to the exciting current.

14. A method according to claim 8, wherein the plurality of command values include a third command value used to determine the output voltage of the generator, the conductivity of the control element is controlled based on a voltage control signal composed of a train of pulses of high and low voltage levels at predetermined periods with a reference duty in each period, the reference duty being determined based on comparison of the third command value with the output voltage of the generator, and wherein the operating rate of the generator is equivalent to the reference duty of the voltage control signal.

15. A system for determining whether a charging wire connecting between a battery and a generator is broken, in which the generator is configured to charge the battery through the charging wire, the system comprising:
a first unit configured to measure a voltage of the battery;
a second unit configured to detect an operating rate of the generator; and
a third unit configured to determine that the charging wire is broken when the measured battery voltage is lower than a predetermined threshold voltage and the detected operating rate of the generator is lower than a predetermined threshold value.

16. A system according to claim 15, wherein the generator includes a conductivity control element and outputs a voltage created by magnetic fluxes, the magnetic fluxes being generated in the generator based on an exciting current, the exciting current being supplied to the generator through the control element such that the control element controls its conductivity with respect to the exciting current based on a plurality of command values, the plurality of command values including a first command value determining an upper limit of the operating rate, and wherein the predetermined threshold value is lower than the first command value.

17. A system according to claim 16, wherein the plurality of command values include a second command value used to determine the output voltage of the generator, and an electrical load is directly connected to the generator without through the charging line, further comprising:
a fourth unit configured to change the second command value to a predetermined value for protecting the electrical load when the third unit determines that the charging wire is broken; and
a fifth unit configured to put out an alert when the third unit determines that the charging wire is broken.

18. A system according to claim 17, wherein the predetermined voltage is higher than an open-circuit voltage of the battery, and equal to or lower than a maximum permissible voltage of the electrical load directly connected to the generator.

19. A system according to claim 16, wherein the plurality of command values include a second command value used to determine the output voltage of the generator, the conductivity of the control element is controlled based on a voltage control signal composed of a train of pulses of high and low voltage levels at predetermined periods with a reference duty in each period, the reference duty being determined based on comparison of the second command value with the output voltage of the generator, and wherein the operating rate of the generator is equivalent to the reference duty of the voltage control signal.

20. A system for determining whether a charging wire connecting between a battery and a generator is broken, in which the generator is configured to charge the battery through the charging wire, the system comprising:
a first unit configured to determine whether the battery is in discharge;
a second unit configured to detect an operating rate of the generator; and
a third unit configured to determine that the charging wire is broken when it is determined that the battery is in discharge and the detected operating rate is within a predetermined range, the predetermined range being determined by an upper limit threshold value and a lower limit threshold value.

21. A system according to claim 20, where the generator includes a conductivity control element and outputs a voltage created by magnetic fluxes, the magnetic fluxes being generated in the generator based on an exciting current, the exciting current being supplied to the generator through the control element such that the control element controls its conductivity with respect to the exciting current based on a plurality of command values.

22. A system according to claim 20, wherein the first unit is configured to compare a current of the battery with a predetermined threshold current value, and to determine the battery is in discharge based on the compared result.

23. A system according to claim 20, wherein the plurality of command values include a first command value used to determine the output voltage of the generator, and an electrical load is directly connected to the generator without through the charging line, further comprising:
a fourth unit configured to change the first command value to a predetermined value for protecting the electrical load when the third unit determines that the charging wire is broken; and
a fifth unit configured to put out an alert when the third unit determines that the charging wire is broken.

24. A system according to claim 23, wherein the predetermined voltage is higher than an open-circuit voltage of the battery, and equal to or lower than a maximum permissible voltage of the electrical load directly connected to the generator.

25. A battery charging system comprising:
a battery;
a generator;
a charging wire connecting between the battery and the generator, the generator being configured to charge the battery through the charging wire;
a first unit configured to measure a voltage of the battery;
a second unit configured to detect an operating rate of the generator; and
a third unit configured to determine that the charging wire is broken when the measured battery voltage is lower than a predetermined threshold voltage and the detected operating rate of the generator is lower than a predetermined threshold value.

26. A battery charging system comprising:
- a battery;
- a generator;
- a charging wire connecting between the battery and the generator, the generator being configured to charge the battery through the charging wire;
- a first unit configured to determine whether the battery is in discharge;
- a second unit configured to detect an operating rate of the generator; and
- a third unit configured to determine that the charging wire is broken when it is determined that the battery is in discharge and the detected operating rate is within a predetermined range, the predetermined range being determined by an upper limit threshold value and a lower limit threshold value.

* * * * *